United States Patent
Tamamori et al.

(10) Patent No.: US 6,818,911 B2
(45) Date of Patent: Nov. 16, 2004

(54) ARRAY STRUCTURE AND METHOD OF MANUFACTURING THE SAME, CHARGED PARTICLE BEAM EXPOSURE APPARATUS, AND DEVICE MANUFACTURING METHOD

(75) Inventors: Kenji Tamamori, Kanagawa (JP); Masato Muraki, Tokyo (JP); Yuichi Iwasaki, Tochigi (JP); Yoshinori Nakayama, Tokyo (JP); Kouji Asano, Tokyo (JP); Yoshiaki Moro, Tokyo (JP); Masayoshi Esashi, Miyagi (JP)

(73) Assignees: Canon Kabushiki Kaisha, Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 10/406,274

(22) Filed: Apr. 4, 2003

(65) Prior Publication Data

US 2003/0218140 A1 Nov. 27, 2003

(30) Foreign Application Priority Data

Apr. 10, 2002 (JP) .................................. 2002-107961
Apr. 10, 2002 (JP) .................................. 2002-107962

(51) Int. Cl.$^7$ ............................. G21G 5/00; G21K 5/10
(52) U.S. Cl. .......................... 250/492.22; 250/396 R; 250/444.11
(58) Field of Search ..................... 250/492.22, 492.21, 250/396 R

(56) References Cited

U.S. PATENT DOCUMENTS

| | | | | | |
|---|---|---|---|---|---|
| 5,214,289 A | * | 5/1993 | Betsui | ..................... | 250/396 R |
| 5,215,623 A | * | 6/1993 | Takahashi et al. | ............ | 438/20 |
| 5,262,341 A | * | 11/1993 | Fueki et al. | ................ | 438/618 |
| 6,335,127 B1 | * | 1/2002 | Ono | ............................. | 430/5 |
| 6,559,463 B2 | * | 5/2003 | Ono et al. | ............. | 250/492.22 |
| 6,603,128 B2 | * | 8/2003 | Maehara et al. | ........ | 250/441.11 |

FOREIGN PATENT DOCUMENTS

JP 56-19402 5/1981

* cited by examiner

*Primary Examiner*—John R. Lee
*Assistant Examiner*—Kalimah Fernandez
(74) *Attorney, Agent, or Firm*—Fitzpatrick, Cella, Harper & Scinto

(57) ABSTRACT

This invention provides a reliable blanking aperture array. An insulating layer and conductive layer are sequentially formed on the lower surface of a substrate. Then, a plurality of pairs of opposing trenches are formed in the substrate, and an insulating layer is formed on each of the side surfaces of the trenches by thermal oxidation. The conductive layer is exposed by etching the bottom of each trench. A conductive member is selectively grown in each trench using the conductive layer as a plating electrode to form a blanking electrode. An opening is formed between the opposing blanking electrodes.

29 Claims, 28 Drawing Sheets

F I G. 4M
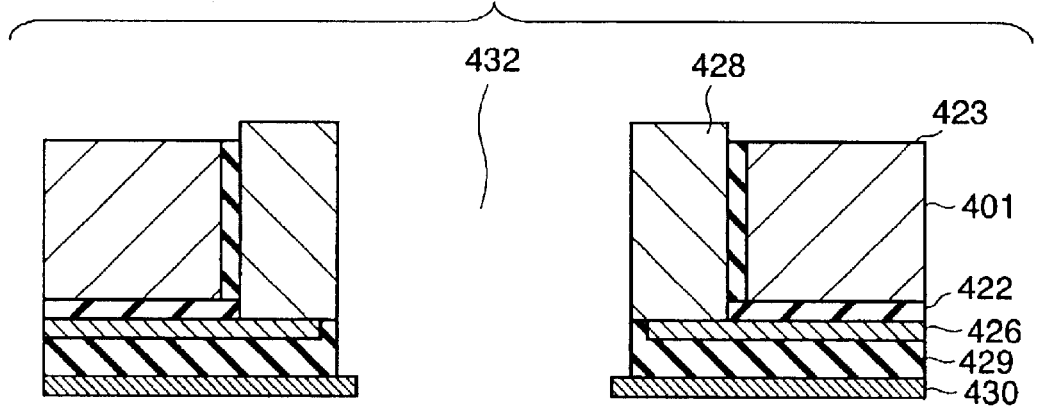
F I G. 5A
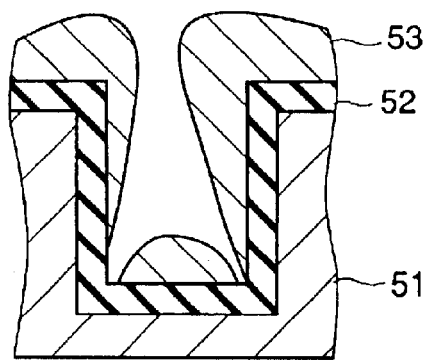
F I G. 5B
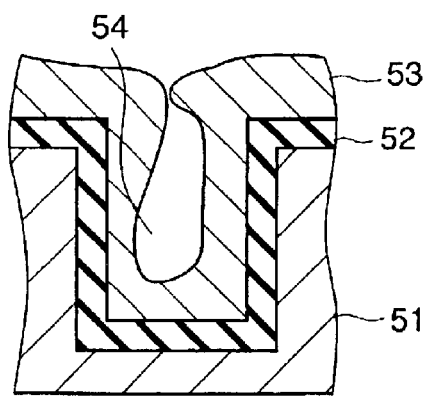

F I G. 16L
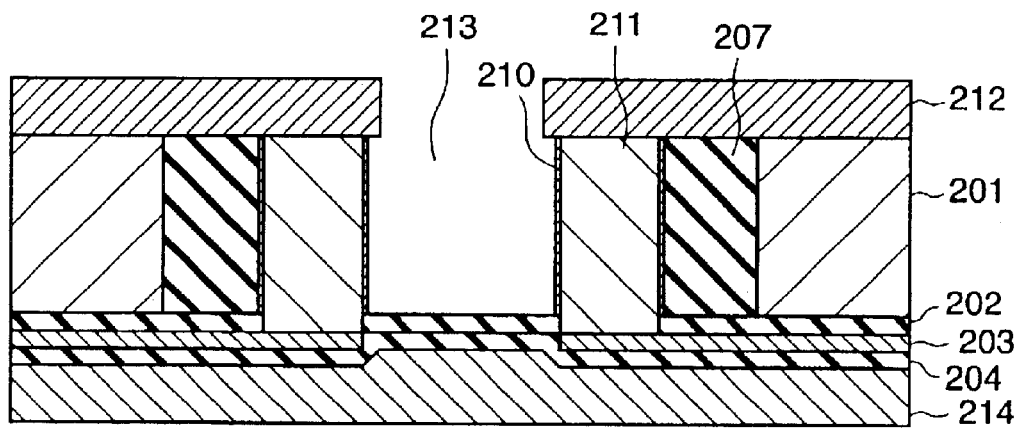
F I G. 16M
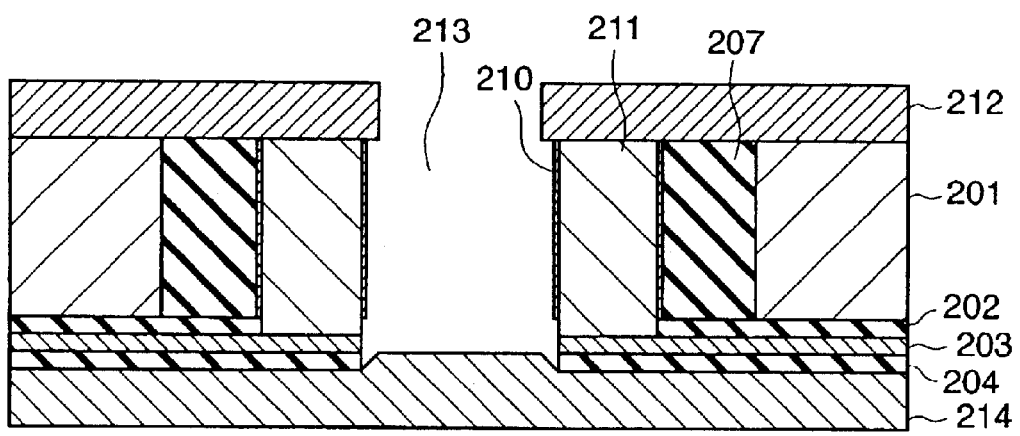
F I G. 16N
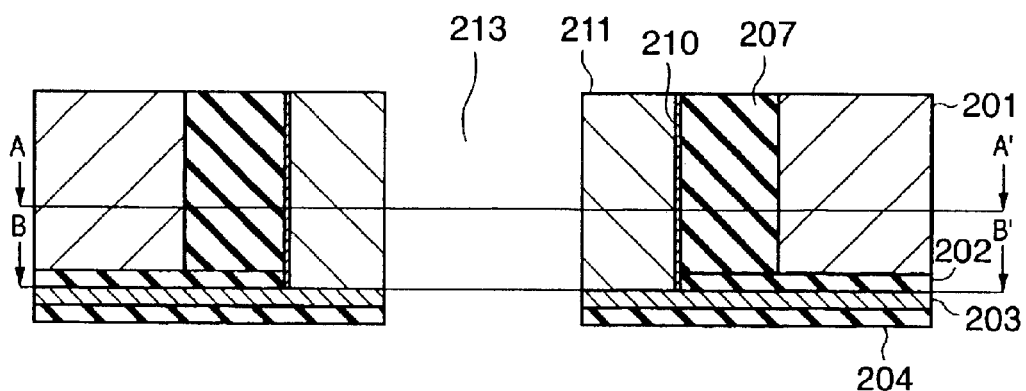

ARRAY STRUCTURE AND METHOD OF MANUFACTURING THE SAME, CHARGED PARTICLE BEAM EXPOSURE APPARATUS, AND DEVICE MANUFACTURING METHOD

FIELD OF THE INVENTION

The present invention relates to an array structure and method of manufacturing the same, a charged particle beam exposure apparatus, and a device manufacturing method and, more particularly, to an array structure which can suitably be used as a blanking aperture array of a charged particle beam exposure apparatus, a method of manufacturing the array structure, a charged particle beam exposure apparatus having the array structure as a blanking aperture array, and a device manufacturing method using the charged particle beam exposure apparatus.

BACKGROUND OF THE INVENTION

A multiple charged particle beam exposure apparatus using a plurality of charged particle beams employs a method of individually controlling irradiation of the plurality of charged particle beams using a blanking aperture array having a plurality of openings (e.g., Utility Model Publication No. 56-19402).

Generally, a blanking aperture array is manufactured by two-dimensionally forming a plurality of openings in a semiconductor crystal substrate made of, e.g., silicon at a predetermined interval and forming a pair of blanking electrodes on both sides of each opening. When voltage application/non-application to each pair of blanking electrodes is controlled in accordance with pattern data, a desired pattern can be formed on a sample.

For example, when one of the pair of blanking electrodes formed in correspondence with each opening is grounded, and a predetermined voltage is applied to the other blanking electrode, an electron beam passing through the opening is deflected. Since the electron beam passes through a lens arranged on the lower side and is then shielded by a single-opening aperture, the beam does not reach the sample surface (a resist layer on the semiconductor substrate). On the other hand, if no voltage is applied to the other electrode, the electron beam passing through the opening is not deflected. Hence, the electron beam passes through the lens arranged on the lower side and reaches the sample surface without being shielded by the single-opening aperture.

The blanking electrode of the blanking aperture array is typically made of a metal. A conventional blanking electrode forming method will be described with reference to FIGS. 19A and 19B. FIG. 19A shows only one of a plurality of pairs of blanking electrodes. FIG. 19B shows only one of the pair of blanking electrodes. First, as shown in FIG. 19A, a pair of trenches are formed in a substrate 41. An insulating film 42 is formed to cover the trench surfaces and substrate surface. A metal (e.g., tungsten) is deposited in the trenches by vapor deposition or sputtering to form a pair of metal electrodes 43. The substrate portion between the pair of metal electrodes 43 is removed by etching to form an opening. The insulating films on side surfaces of the opening are removed by etching.

In the conventional metal electrode forming method, since the depth of the trench is large relative to its width. Hence, as shown in FIG. 19B, in forming the insulating film 42 on the trench surface, the insulating film 42 may not uniformly be formed on the trench surface. In this case, the uncovered substrate 41 may electrically short-circuit to the metal electrode 43.

If the substrate 41 and metal electrode 43 electrically short-circuit, no predetermined voltage can be applied to the metal electrode 43. Accordingly, since the electron beam cannot appropriately be deflected, no desired pattern can be formed on a sample.

Additionally, even when the substrate 41 and metal electrode 43 do not short-circuit yet in manufacturing, they may short-circuit during use of the exposure apparatus due to, e.g., degradation at the thin portion of the insulating film 42.

Furthermore, in the conventional blanking electrode forming method, when the metal is deposited in the trench (the trench is filled with the metal), a void (cavity) is formed at the center of the trench, as shown in FIGS. 5A and 5B. It is therefore difficult to completely fill the trench.

More specifically, in the conventional forming method, a trench is formed in, e.g., a silicon substrate 51 by selective etching (trench etching). An $SiO_2$ insulating film 52 is formed on the entire surface of the substrate 51, including the trench. Tungsten 53 as a prospective blanking electrode is deposited by sputtering. At this time, since the entire underlying layer of the tungsten 53 is made of the insulating film 52, the trench cannot be filled with the metal using selective growth, and a void 54 may be formed, as shown in FIG. 5B.

With such a void formed in a blanking electrode, when an opening is formed between a pair of blanking electrodes, and the insulating films 52 on the side surfaces of the opening are removed, the blanking electrode may partially break. Even when the blanking electrode does not break during manufacturing the blanking aperture array, the blanking electrode may be deformed by heat applied to it during use of the exposure apparatus having the blanking aperture array. The interval between the pair of blanking electrodes may vary accordingly. In this case, the electron beam cannot appropriately be deflected, and no desired pattern can be formed on a sample.

That is, in the conventional manufacturing method, it is difficult to manufacture a reliable blanking aperture array at a high yield.

SUMMARY OF THE INVENTION

The present invention has been made in consideration of the above situation, and has as its object to provide a highly reliable array structure such as a blanking aperture array, a method of manufacturing such an array structure at a high yield, a charged particle beam exposure apparatus having such an array structure, and a device manufacturing method using such a charged particle beam exposure apparatus.

According to the first aspect of the present invention, there is provided a method of manufacturing an array structure having a plurality of openings and a plurality of pairs of opposing electrodes which are arranged in correspondence with each of the plurality of openings to control loci of a plurality of charged particle beams that pass through the plurality of openings, respectively. The manufacturing method is characterized by comprising a trench formation step of forming a plurality of pairs of opposing trenches in a substrate, a side-surface insulating layer formation step of forming an insulating layer on a side surface of each of the plurality of pairs of opposing trenches, a process step of processing the plurality of pairs of trenches to expose a conductive layer to a bottom portion of each of the plurality of pairs of opposing trenches, an electrode formation step of selectively growing a conductive material on the conductive layer exposed to the bottom portion of each of the plurality of pairs of trenches to fill the plurality of pairs of trenches with the conductive material, thereby forming a plurality of pairs of opposing electrodes, and an opening formation step of forming an opening between each of the pairs of opposing electrodes.

According to a preferred embodiment of the present invention, in the electrode formation step, the conductive material is preferably grown in the plurality of pairs of opposing trenches by plating using, as a plating electrode, the conductive layer exposed to the bottom portion of each of the plurality of pairs of opposing trenches.

When one of two surfaces of the substrate, where formation of the plurality of pairs of opposing trenches starts in the trench formation step, is defined as an upper surface side, the manufacturing method preferably further comprises a lower-surface-side insulating layer formation step of, before the trench formation step, forming an insulating layer on a lower surface side of the substrate, and a conductive layer formation step of, after the lower-surface-side insulating layer formation step before the process step, forming the conductive layer on the insulating layer on the lower surface side of the substrate.

Alternatively, the manufacturing method preferably further comprises a lower-surface-side first insulating layer formation step of, before the trench formation step, forming a first insulating layer on a lower surface side of the substrate while defining, as an upper surface side, one of two surfaces of the substrate, where formation of the plurality of pairs of opposing trenches starts in the trench formation step, a conductive layer formation step of, after the lower-surface-side first insulating layer formation step before the process step, forming the conductive layer on the insulating layer on the lower surface side of the substrate, and a lower-surface-side second insulating layer formation step of, after the conductive layer formation step before the electrode formation step, forming a second insulating layer on, of exposing surfaces of the conductive layer, a surface opposite to the plurality of pairs of opposing trenches.

According to a preferred embodiment of the present invention, in the process step, the conductive layer is preferably exposed to the bottom portion by selectively etching an insulating layer at the bottom portion of each of the plurality of pairs of opposing trenches while leaving the insulating layer having a sufficient thickness formed on the side surface of each of the plurality of pairs of opposing trenches.

The manufacturing method may further comprise an interconnection layer formation step of forming an interconnection layer to be electrically connected to the plurality of pairs of opposing electrodes. In the interconnection layer formation step, the interconnection layer may be formed on a side of one of two surfaces of the substrate, where formation of the plurality of pairs of opposing trenches starts in the trench formation step, or on an opposite side. In the interconnection layer formation step, the interconnection layer which can individually control a potential difference to be applied to each of the plurality of pairs of opposing electrodes can be formed.

According to a preferred embodiment of the present invention, in the trench formation step, the plurality of pairs of opposing trenches preferably are so formed as to cause the plurality of pairs of opposing electrodes formed by filling the plurality of pairs of opposing trenches with the conductive material to shield the plurality of charged particle beams from insulating layers outside the plurality of pairs of opposing electrodes.

According to the second aspect of the present invention, there is provided a charged particle beam exposure apparatus which forms a pattern on a wafer using a plurality of charged particle beams, characterized by comprising a beam source which generates a plurality of charged particle beams, and a blanking aperture array which controls loci of the plurality of charged particle beams generated by the beam source to individually control whether the wafer is to be irradiated with the plurality of charged particle beams, wherein the blanking aperture array is an array structure manufactured by the above manufacturing method.

According to the third aspect of the present invention, there is provided a device manufacturing method of manufacturing a device through a lithography step, characterized in that the lithography step comprises a step of forming a pattern on a wafer using the above charged particle beam exposure apparatus.

According to the fourth aspect of the present invention, there is provided a method of manufacturing an array structure having a plurality of openings and a plurality of pairs of opposing electrodes which are arranged in correspondence with each of the plurality of openings to control loci of a plurality of charged particle beams that pass through the plurality of openings, respectively. The manufacturing method is characterized by comprising a first trench formation step of forming a plurality of pairs of opposing first trenches in a substrate, an insulating layer formation step of filling the opposing first trenches with an insulating material to form a plurality of pairs of opposing insulating layers, a second trench formation step of forming a plurality of pairs of opposing second trenches to be arranged inside the plurality of pairs of opposing insulating layers, an electrode formation step of filling the opposing second trenches with a conductive material to form a plurality of pairs of opposing electrodes, and an opening formation step of forming an opening between each of the pairs of opposing electrodes.

According to a preferred embodiment of the present invention, the manufacturing method may further comprise an interconnection layer formation step of forming an interconnection layer which applies a potential difference to the pairs of opposing electrodes. In the interconnection layer formation step, typically, the interconnection layer which can individually control the potential difference to be applied to each of the plurality of pairs of opposing electrodes can be formed. For example, preferably, the interconnection layer formation step is executed before the second trench formation step, and in the second trench formation step, the plurality of pairs of opposing second trenches are formed to communicate with the interconnection layer formed in the interconnection layer formation step.

According to a preferred embodiment of the present invention, in the electrode formation step, for example, the plurality of pairs of opposing second trenches are filled with the conductive material by plating using, as a plating electrode, the interconnection layer exposed to the bottom portion of each of the plurality of pairs of opposing second trenches after the second trench formation step.

According to a preferred embodiment of the present invention, in the insulating layer formation step, for example, the plurality of pairs of opposing first trenches are filled with silicon oxide as the insulating material formed using TEOS.

According to a preferred embodiment of the present invention, the manufacturing method further comprises a step of forming an insulating layer on a lower surface of the substrate, and in the first trench formation step, the plurality of pairs of opposing first trenches are formed by etching a predetermined portion of the substrate using the insulating layer formed on the lower surface of the substrate as an etching stopper.

According to a preferred embodiment of the present invention, in the second trench formation step, the plurality of pairs of opposing second trenches are so formed as to cause the plurality of pairs of opposing electrodes formed by filling the plurality of pairs of opposing second trenches with the conductive material to shield the plurality of charged particle beams from the plurality of pairs of opposing insulating layers.

According to the fifth aspect of the present invention, there is provided an array structure having a plurality of openings formed in a substrate and a plurality of pairs of opposing electrodes which are arranged in correspondence with each of the plurality of openings to control loci of a plurality of charged particle beams that pass through the plurality of openings, respectively, characterized in that each of the opposing electrodes is supported by the substrate through an insulating layer and arranged to shield a charged particle beam that passes between the opposing electrodes from the insulating layer.

The plurality of pairs of opposing electrodes can be formed by, e.g., plating. The insulating layer can be formed by forming a trench in the substrate and then filling the trench with an insulating material. Filling of the insulating material can be done by depositing a silicon oxide film using TEOS.

According to the sixth aspect of the present invention, there is provided a charged particle beam exposure apparatus which forms a pattern on a wafer using a plurality of charged particle beams, characterized by comprising a beam source which generates a plurality of charged particle beams, and a blanking aperture array which controls loci of the plurality of charged particle beams generated by the beam source to individually control whether the wafer is to be irradiated with the plurality of charged particle beams, wherein the blanking aperture array is an array structure manufactured by the above manufacturing method.

According to the seventh aspect of the present invention, there is provided a charged particle beam exposure apparatus which forms a pattern on a wafer using a plurality of charged particle beams, characterized by comprising a beam source which generates a plurality of charged particle beams, and a blanking aperture array which controls loci of the plurality of charged particle beams generated by the beam source to individually control whether the wafer is to be irradiated with the plurality of charged particle beams, wherein the blanking aperture array is the above array structure.

According to the eighth aspect of the present invention, there is provided a device manufacturing method of manufacturing a device through a lithography step, characterized in that the lithography step comprises a step of forming a pattern on a wafer using the above charged particle beam exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 4A to 4M are sectional views for explaining the second embodiment of a method of manufacturing a blanking aperture array (array structure) of an electron beam exposure apparatus;

FIGS. 5A and 5B are views showing a conventional blanking electrode forming method;

DETAILED DESCRIPTION OF THE PREFERRED EMBODIMENTS

An electron beam exposure apparatus according to a preferred embodiment of the present invention will be described below with reference to the accompanying drawings. This electron beam exposure apparatus is however merely an application example of the present invention. The present invention can also be applied to an exposure apparatus using a charged particle beam except an electron beam, e.g., an ion beam.

The schematic arrangement of the electron beam exposure apparatus according to the preferred embodiment of the present invention will be described first.

Figure 6A:
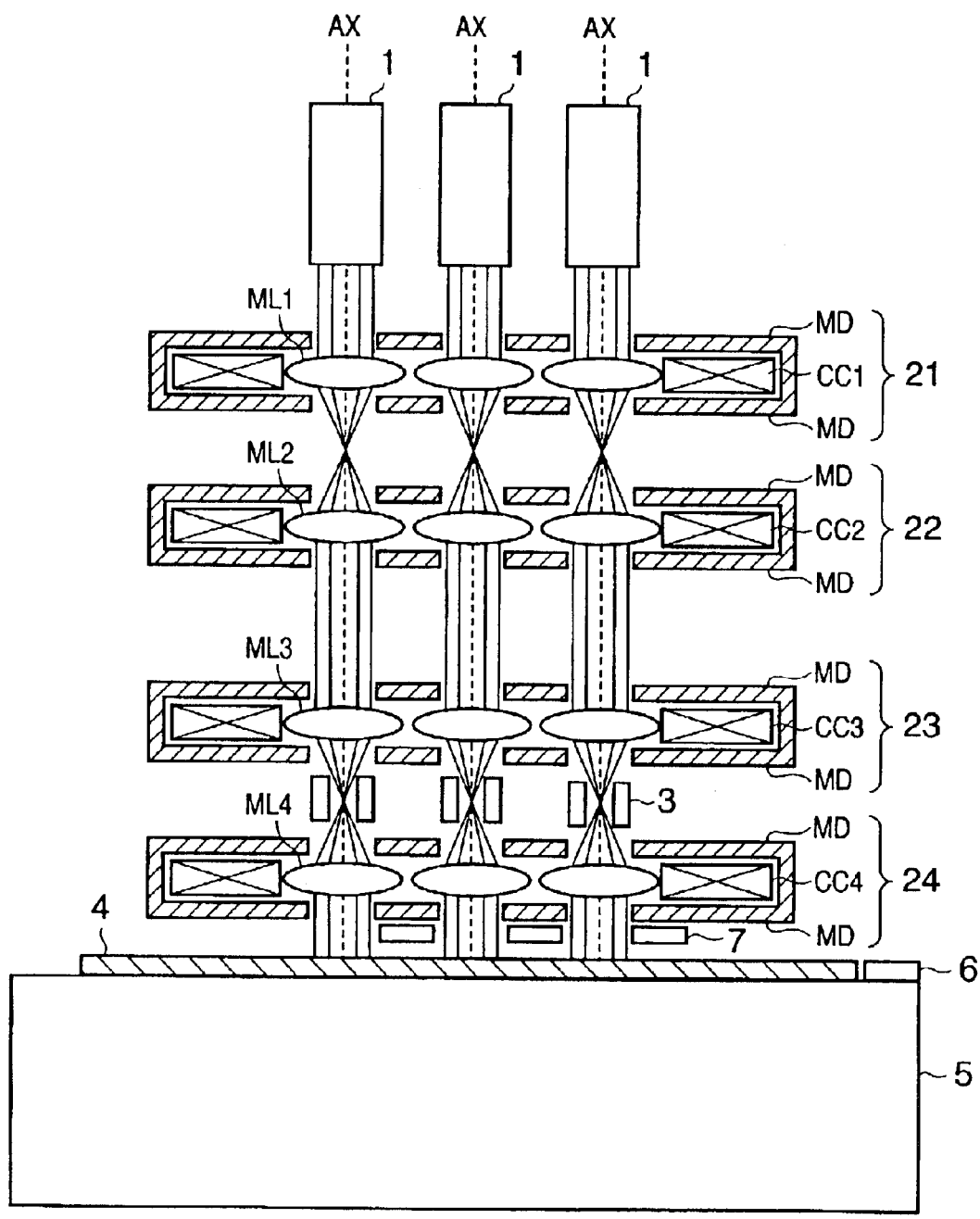
FIG. 6A is a view schematically showing an electron beam exposure apparatus according to a preferred embodiment of the present invention.
Figure 6B:
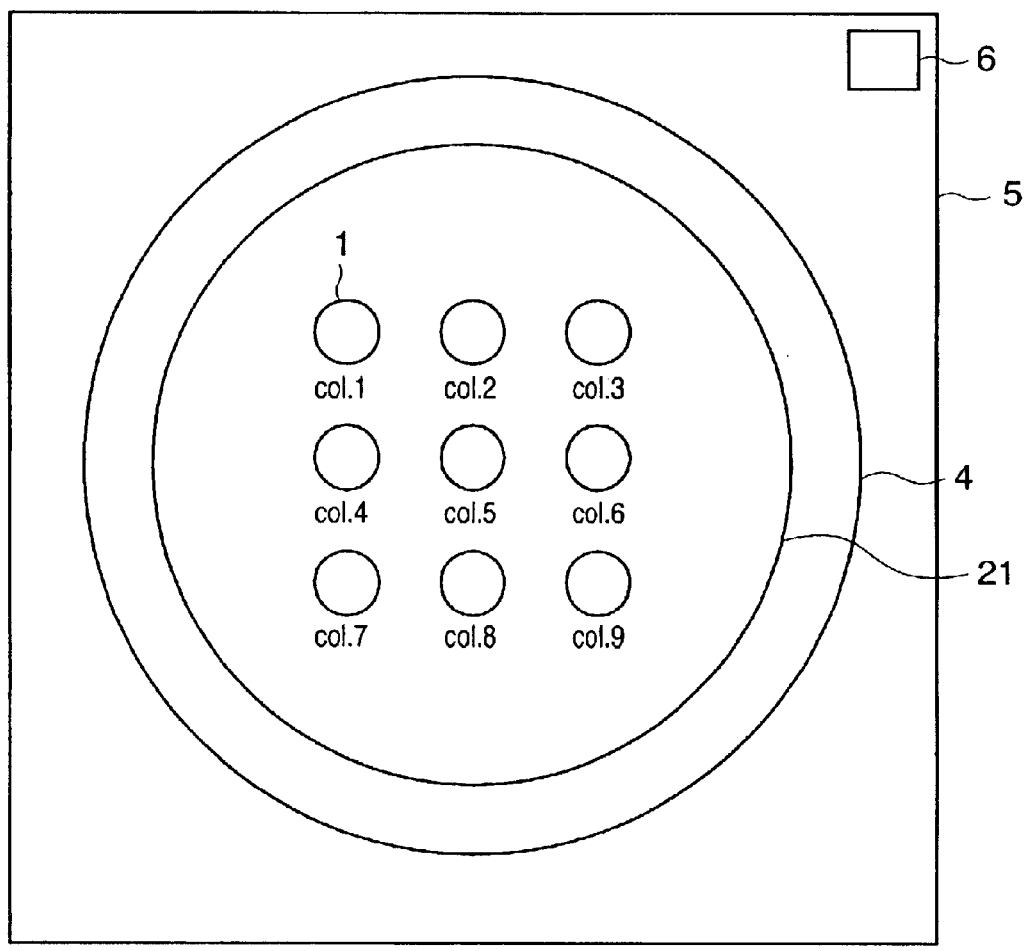
FIG. 6B is a plan view showing the electron beam exposure apparatus shown in FIG. 6A.

FIG. 6A is a view schematically showing the electron beam exposure apparatus according to the preferred embodiment of the present invention. FIG. 6B is a plan view of the electron beam exposure apparatus shown in FIG. 6A. FIG. 6A shows sections of electromagnetic lens arrays 21, 22, 23, and 24.

This exposure apparatus has a plurality of multi-source modules 1 each serving as an electron beam source that generates electron beams. Each multi-source module 1 forms a plurality of electron source images and radiates a plurality of electron beams corresponding to the electron source images. In this embodiment, 3×3 multi-source modules 1 are arrayed. The multi-source module 1 will be described later in detail.

The electromagnetic lens arrays 21, 22, 23, and 24 are arranged between the plurality of multi-source modules 1 and a stage 5. In each electromagnetic lens array, two magnetic disks MD each having openings which have the same shape and are arrayed in a 3×3 structure in correspondence with the array of the multi-source modules 1 are arranged apart on the upper and lower sides. The electromagnetic lens arrays are excited by common coils CC1, CC2, CC3, and CC4. As a result, each opening portion forms the magnetic pole of one of electromagnetic lenses ML which generate the same lens magnetic field in terms of design. The plurality of electron source images formed by each multi-source module 1 are projected onto a wafer 4 held on the stage 5 through four electromagnetic lens arrays (ML1, ML2, ML3, and ML4) corresponding to the electromagnetic lens arrays 21, 22, 23, and 24, respectively. An electrooptic system which causes a field such as a magnetic field to act on the electron beam emitted from one multi-source module 1 before the wafer is irradiated with the electron beam will be defined as a column. That is, the exposure apparatus of this embodiment has nine columns (col. 1 to col. 9).

An electromagnetic lens of the electromagnetic lens array 21 and a corresponding electromagnetic lens of the electromagnetic lens array 22 form the intermediate images of the electron sources of in the multi-source module 1. Subsequently, an electromagnetic lens of the electromagnetic lens array 23 and a corresponding electromagnetic lens of the electromagnetic lens array 24 form other intermediate images of the electron sources on the wafer 4. That is, the electron sources in the multi-source module 1 are projected onto the wafer 4. When the excitation conditions of the electromagnetic lens arrays 21, 22, 23, and 24 are individually controlled by the coils CC1, CC2, CC3, and CC4, respectively, the optical characteristics (focal position, image rotation, and magnification factor) of the columns can be adjusted almost uniformly (i.e., by the same amount).

Each column has a main deflector 3. The main deflector 3 deflects the plurality of electron beams from the corresponding multi-source module 1 to displace the images of the plurality of electron sources in the X and Y directions on the wafer 4.

The stage 5 can move the wafer 4 placed thereon in the X and Y directions perpendicular to an optical axis AX (Z-axis) and in the rotation direction about the Z-axis. A stage reference plate 6 is fixed on the stage 5.

A reflected electron detector 7 detects reflected electrons that are generated when a mark on the stage reference plate 6 is irradiated with the electron beam.

Figure 7:
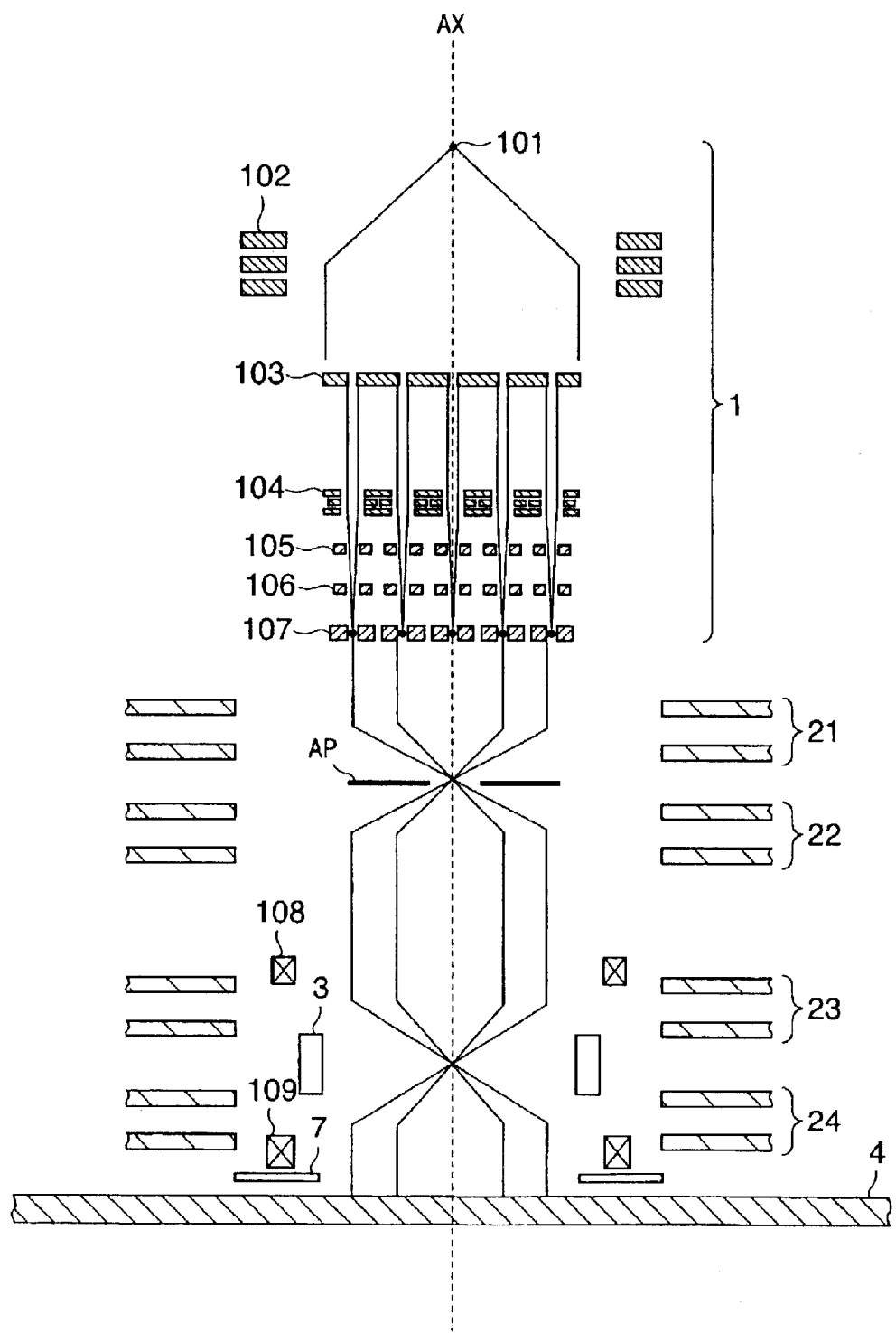
FIG. 7 is a view showing a detailed structure of one of columns shown in FIG. 6A.

FIG. 7 is a view showing a detailed structure of one of the columns shown in FIG. 6A. The detailed structures of the multi-source module 1 and column will be described with reference to FIG. 7.

The multi-source module 1 has an electron gun (not shown) which forms an electron source (crossover image) 101. The flow of electrons radiated from the electron source 101 becomes an almost parallel electron beam through a condenser lens 102. The condenser lens 102 of this embodiment is an electrostatic lens having three opening electrodes.

An aperture array 103 having a plurality of openings two-dimensionally arrayed is irradiated with the almost parallel electron beam formed through the condenser lens 102 so that an electron beam passes through each of the plurality of openings. The plurality of electron beams that have passed through the aperture array 103 pass through a lens array 104 in which electrostatic lenses having the same optical power are two-dimensionally arrayed. The electron beams further pass through deflector arrays 105 and 106 each formed by two-dimensionally arraying electrostatic eight-pole deflectors that can individually be driven. The electron beams also pass through a blanking aperture array (to also be referred to as a blanker array hereinafter) 107 formed by two-dimensionally arraying electrostatic blankers that are drivable individually. A preferred structure and manufacturing method of the blanker array 107 will be described later as first and second embodiments.

Figure 8:
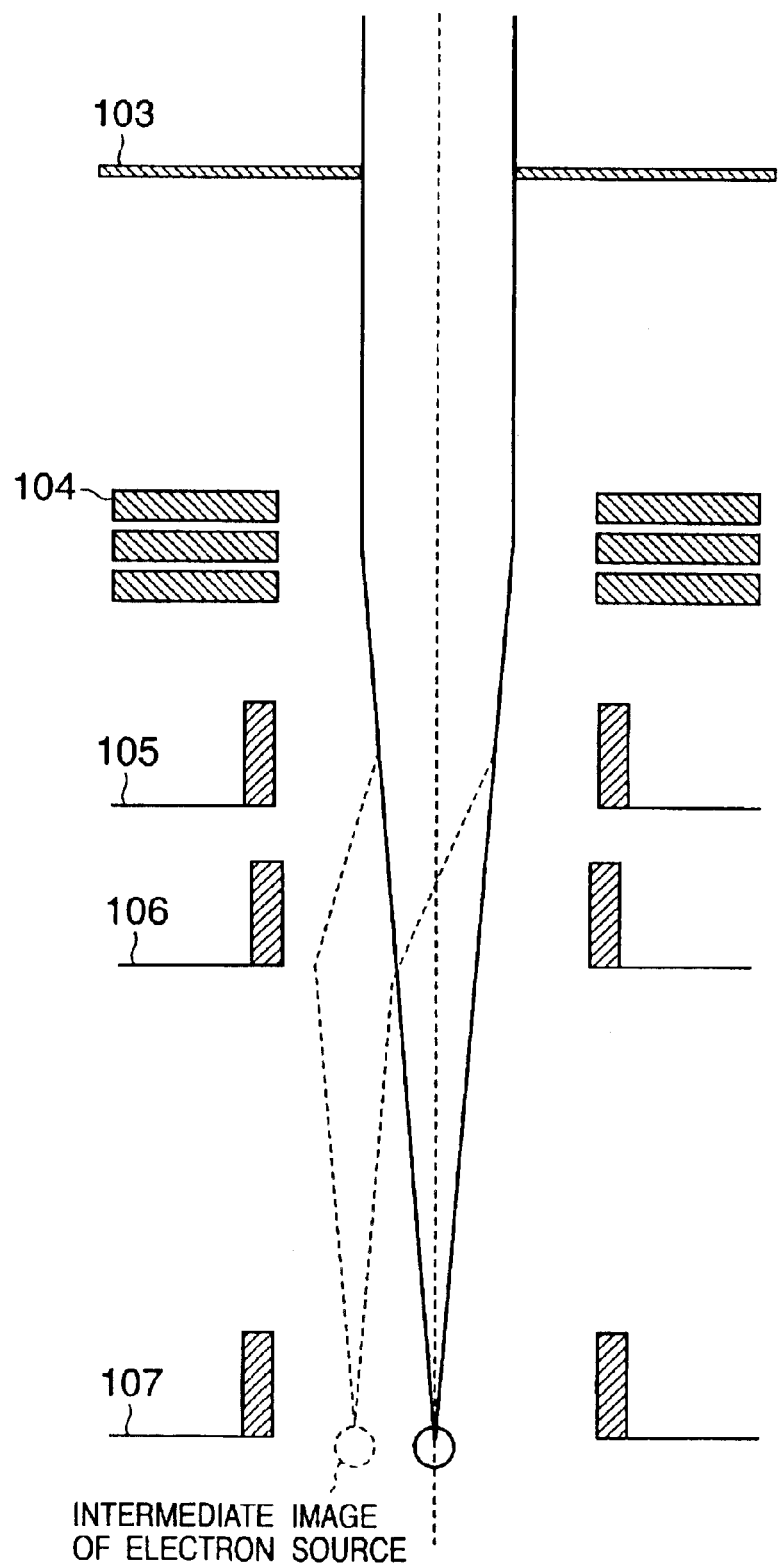
FIG. 8 is an enlarged view of part of a multi-source module.

FIG. 8 is an enlarged view of part of the multi-source module 1. The function of each part of the multi-source module 1 will be described with reference to FIG. 8. The almost parallel electron beam formed through the condenser lens 102 is divided into a plurality of electron beams through the aperture array 103 having a plurality of openings. Each of the plurality of electron beams divided forms the intermediate image of the electron source on a corresponding blanker (more exactly, between the blanking electrodes of each blanker) of the blanker array 107 through a corresponding electrostatic lens of the lens array 104.

Each deflector of the deflector arrays 105 and 106 has a function of individually adjusting the position (position in the plane perpendicular to the optical axis AX) of the intermediate image of an electron source formed at the position of a corresponding blanker on the blanker array 107.

An electron beam (i.e., an electron beam having a changed locus) deflected by each blanker of the blanker array 107 is shielded by a blanking aperture (corresponding to the above-described single-opening aperture) AP shown in FIG. 7, so the wafer 4 is not irradiated with the electron beam. On the other hand, an electron beam (i.e., an electron whose locus is not changed) which is not deflected by the blanker array 107 is not shielded by the blanking aperture AP, so the wafer 4 is irradiated with the electron beam. That is, when the plurality of electron beams are individually controlled by the plurality of blankers of the blanker array 107 depending on whether the wafer 4 is to be irradiated with them while deflecting the plurality of electrons by the main deflector 3, a desired pattern can be formed in the wafer 4.

Referring back to FIG. 7, the plurality of intermediate images of the electron sources formed in each multi-source module 1 are projected onto the wafer 4 through corresponding four electromagnetic lenses (four electromagnetic lenses of the same column) of the electromagnetic lens arrays 21, 22, 23, and 24.

Of the optical characteristics of each column when the plurality of intermediate images are projected onto the wafer 4, image rotation and magnification factor can be individually corrected by the deflector arrays 105 and 106 each having a plurality of independent deflectors for individually adjusting each intermediate image position (i.e., electron beam incident position on the electromagnetic lens array) on the blanker array 107. That is, each of the deflector arrays 105 and 106 functions as an electrooptic element which individually corrects, for each column, the image rotation and magnification factor of the images projected onto the wafer 4. On the other hand, the focal position of each column can be individually adjusted by dynamic focus lenses (electrostatic or magnetic lenses) 108 and 109 arranged for each column. That is, each of the dynamic focus lenses 108 and 109 functions as an electrooptic element which individually corrects the focal position for each column.

Figure 9:
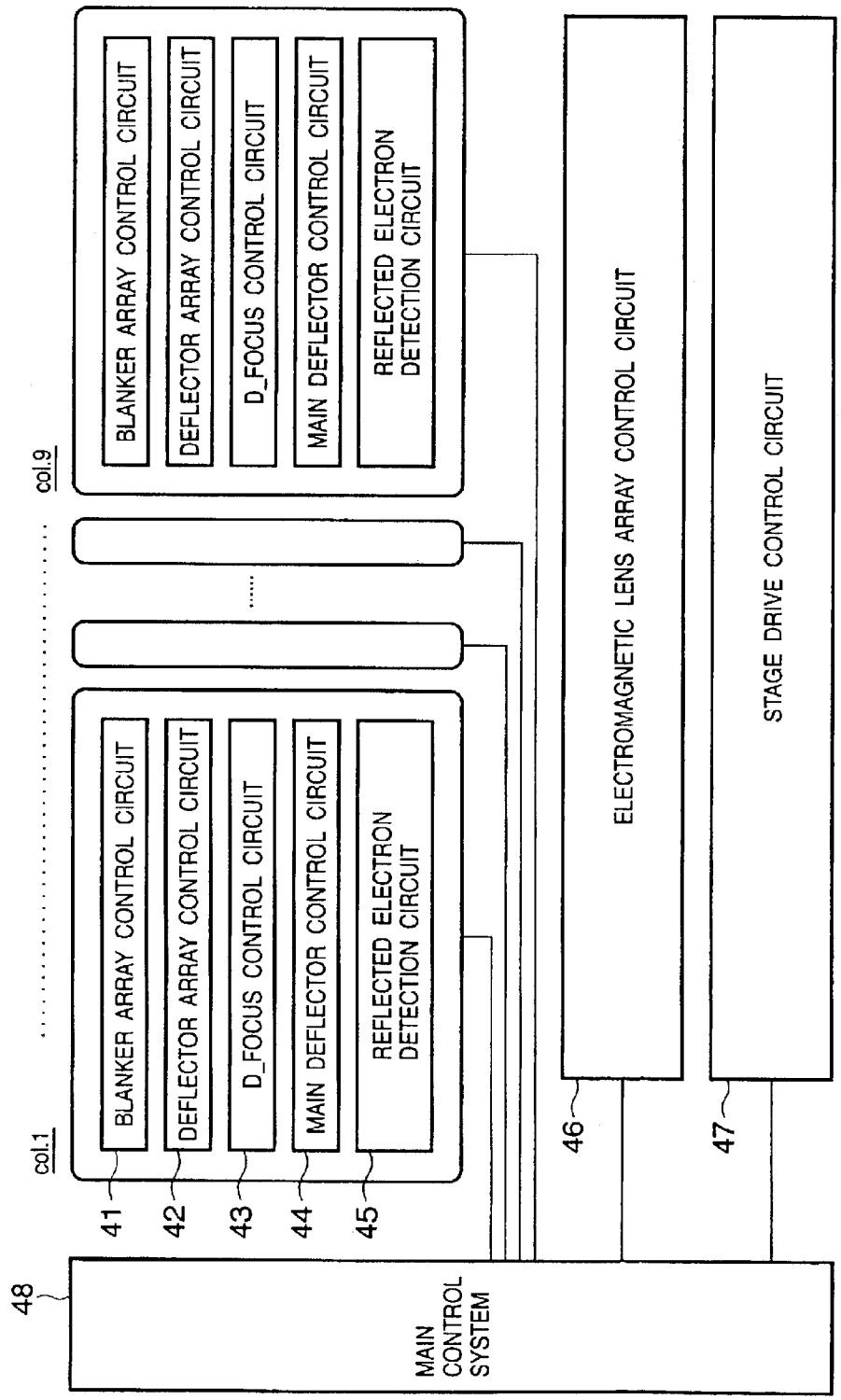
FIG. 9 is a block diagram showing the system arrangement of the electron beam exposure apparatus.

FIG. 9 is a block diagram showing the system arrangement of the electron beam exposure apparatus described above.

A blanker array control circuit 41 individually controls the plurality of blankers (blanking electrodes) that constitute the blanker array 107. A deflector array control circuit 42 individually controls the plurality of deflectors that constitute the deflector arrays 105 and 106. A D_FOCUS control circuit 43 individually controls the dynamic focus lenses 108 and 109. A main deflector control circuit 44 controls the main deflector 3. A reflected electron detection circuit 45 processes a signal from the reflected electron detector 7. The blanker array control circuits 41, deflector array control circuits 42, D_FOCUS control circuits 43, main deflector control circuits 44, and reflected electron detection circuits 45 are arranged equal in number to the columns (nine columns col. 1 to col. 9).

A electromagnetic lens array control circuit 46 controls the common coils CC1, CC2, CC3, and CC4 of the electromagnetic lens arrays 21, 22, 23, and 24. A stage drive control circuit 47 drive-controls the stage 5 in cooperation with a laser interferometer (not shown) which detects the position of the stage 5. A main control system 48 controls the plurality of control circuits and manages the entire electron beam exposure apparatus.

(Description of Optical Characteristic Adjusting Method)

Figure 10:
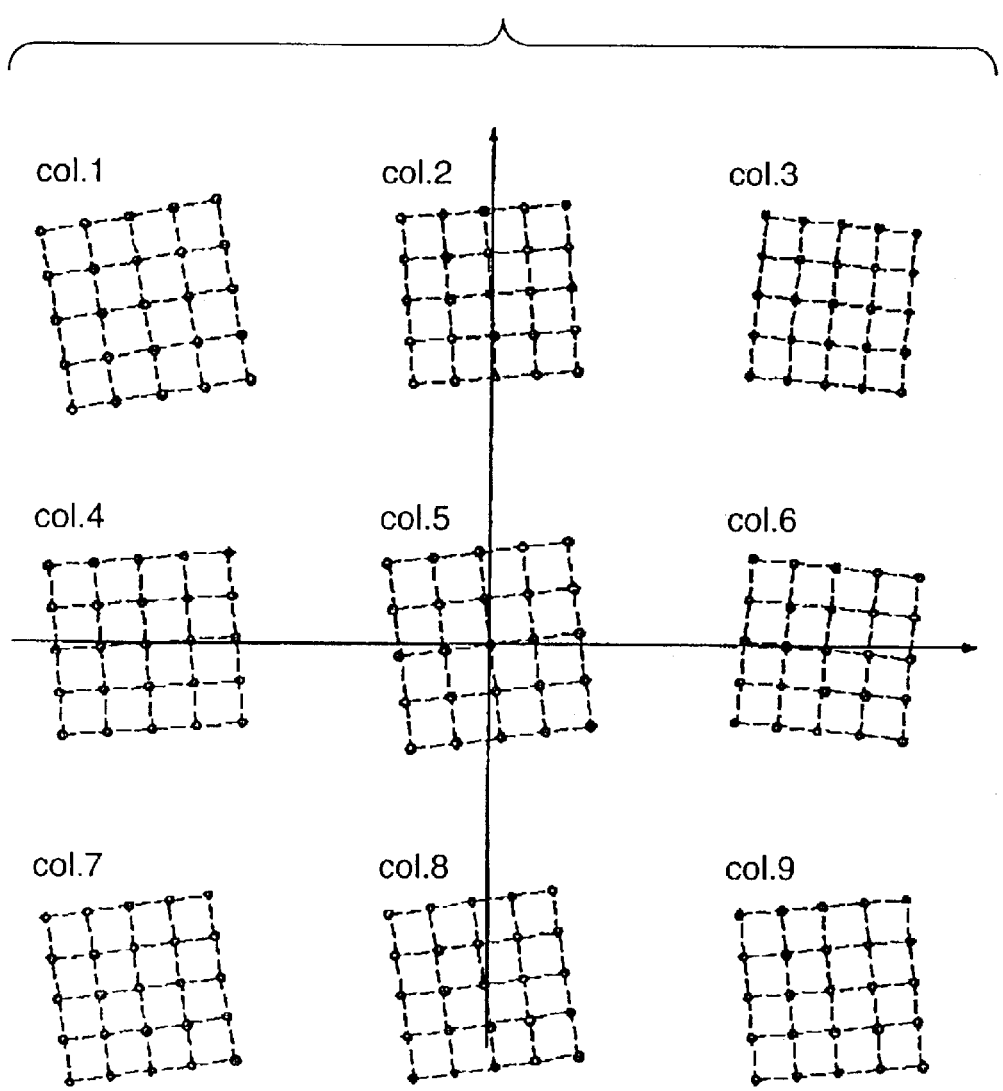
FIG. 10 is a view for explaining the electrooptic characteristics of the plurality of columns.

In the electron beam exposure apparatus of this embodiment, the plurality of electromagnetic lenses that constitute the electromagnetic lens arrays have slightly different electrooptic characteristics due to nonuniformity in permeability and opening shape of the magnetic disk. For example, electron beams with which the wafer is actually irradiated become incident on positions as shown in FIG. 10 because the image rotation and magnification factor change between the columns (FIG. 10 illustrates with an exaggeration). That is, the electrooptic characteristics (focal position, image rotation, magnification factor, and the like) change between the columns.

As a method of solving the above problem, an electrooptic characteristic adjusting method in the electron beam exposure apparatus according to the preferred embodiment of the present invention will be described.

Figure 11:
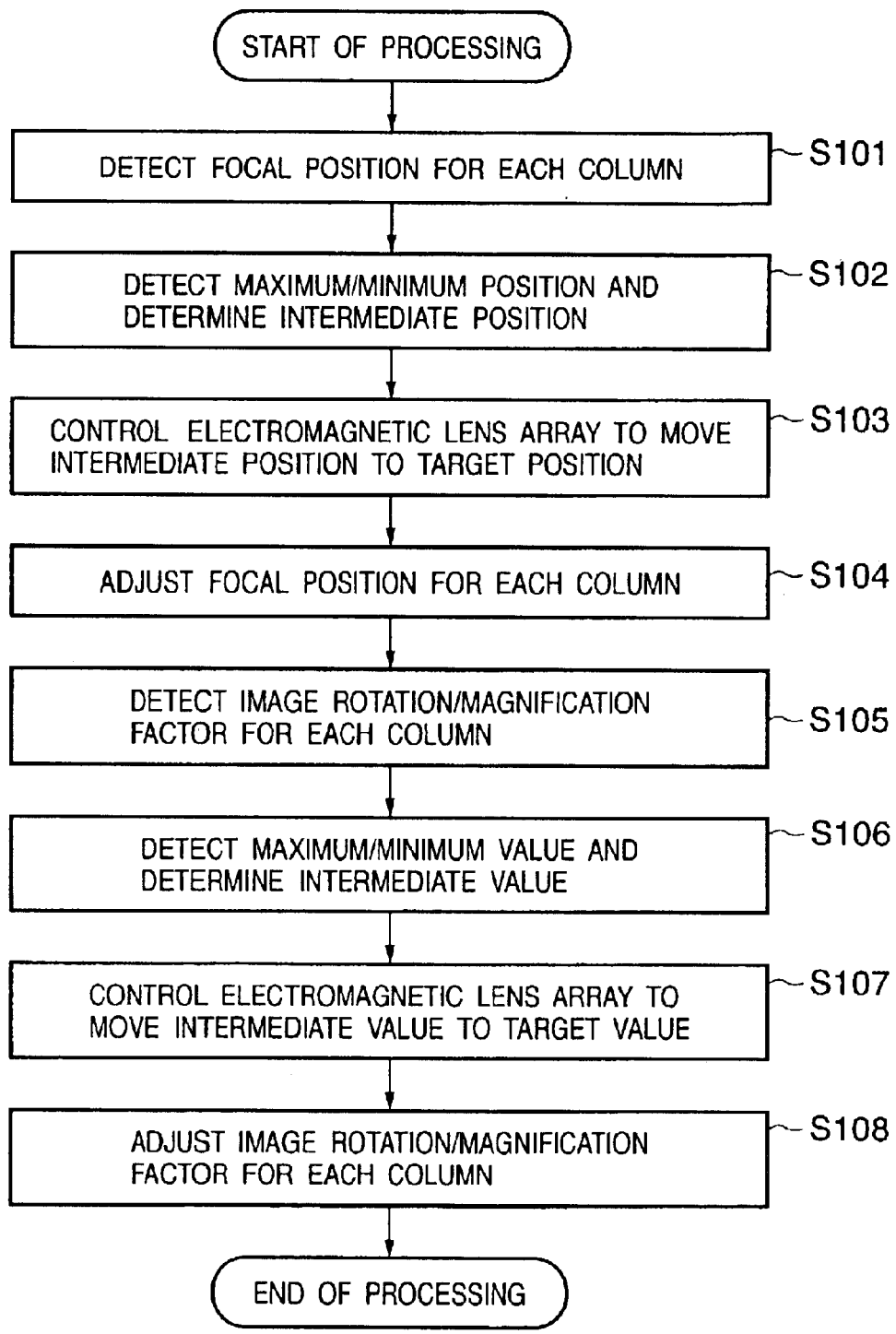
FIG. 11 is a flow chart for explaining electrooptic characteristic adjustment processing.

The main control system 48 executes electrooptic characteristic adjustment processing as shown in FIG. 11. In consideration of changes in electrooptic characteristics of the columns over time and changes in target values of the electrooptic characteristics, the main control system 48 executes the electrooptic characteristic adjustment processing every time, e.g., the pattern to be formed on the wafer is changed (i.e., every time the job is changed). The steps will be described below.

In step S101, to detect the focal position, on the wafer, of an electron beam (in this case, an electron beam that is located at the center of the plurality of electron beams of each column) that represents each column, the main control system 48 instructs the blanker array control circuit 41 to control the blanker array 107 such that the wafer 4 side is irradiated with only the electron beam selected as a focal position detection target.

To do this, the stage 5 is moved in advance by the stage drive control circuit 47 to locate the reference mark of the reference plate 6 near the irradiation position of the selected electron beam. The main control system 48 causes the main deflector control circuit 44 to scan the reference mark by the selected electron beam and obtains, from the reflected electron detection circuit 45, information about reflected electrons from the reference mark while instructing the D_FOCUS control circuit 43 to change the focal position of the electron beam through the dynamic focus lens 108 and/or 109. With this operation, the current focal position of the electron beam is detected. In step S101, the above processing is executed for all electron beams that represent the columns.

Figure 12A:
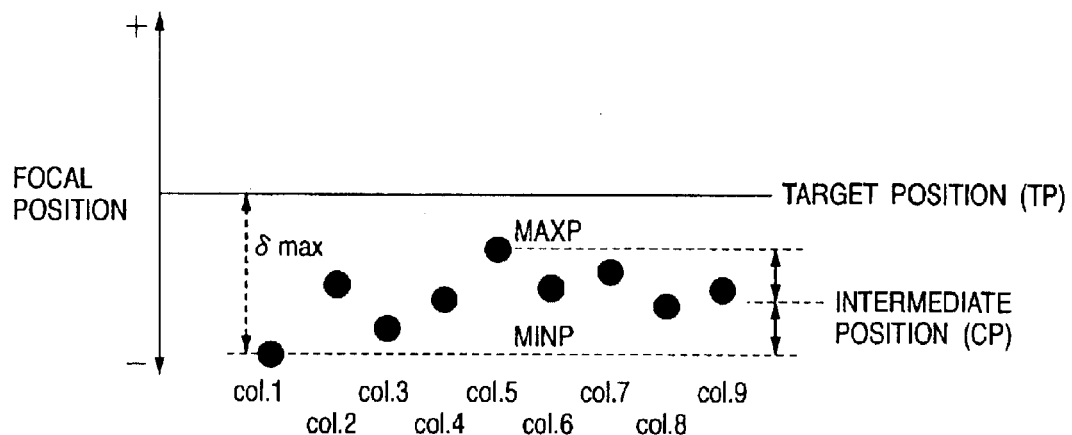
FIGS. 12A and 12B are graphs for explaining focal position adjustment by electromagnetic lens arrays.

In step S102, as shown in FIG. 12A, the main control system 48 detects a maximum position (MAXP) and minimum position (MINP) from the actual focal position detected for each of the electron beams that represent the columns, and determines an intermediate position (CP).

Figure 12B:
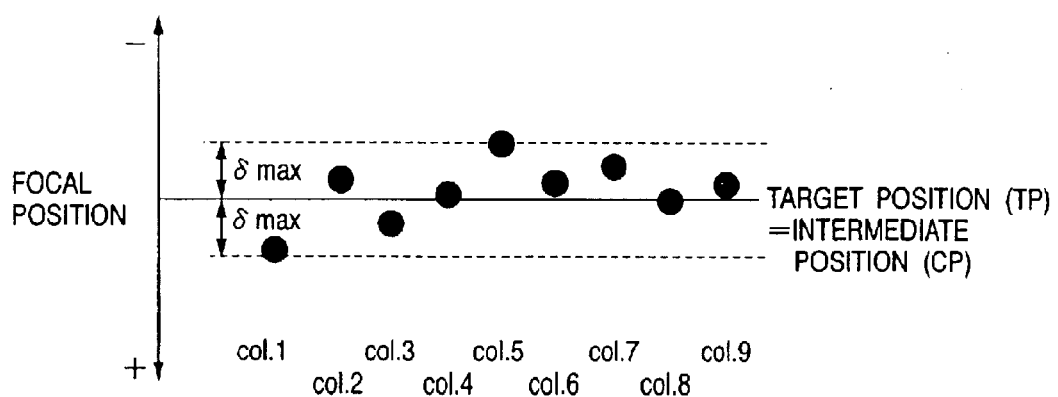

In step S103, the main control system 48 instructs the electromagnetic lens array control circuit 46 to adjust the common coils of the electromagnetic lens arrays 21, 22, 23, and 24 such that the intermediate position (CP) matches a target position (TP) and to move only the focal positions by an almost predetermined amount for all columns. Consequently, a result as shown in FIG. 12B is obtained. More specifically, a maximum value ($\delta$ max) of the difference between the target position and the actual focal position of each column is minimized. In the next step, accordingly, the adjustment amount by the dynamic focus lenses 108 and 109 serving as focal position correcting units arranged for each column can be minimized. This means that the plurality of dynamic focus lenses 108 and 109 arranged for each column can be made compact, and interference therebetween can be minimized.

In step S104, the main control system 48 causes the dynamic focus lenses 108 and 109 to adjust the focal position on the basis of the difference between the target position and the actual focal position of each column, as shown in FIG. 12B, such that the focal position matches the target position.

In step S105, to detect the incident position of each electron beam on the wafer, the main control system 48 instructs the blanker array control circuit 41 to irradiate the wafer side with only the selected electron beam. To do this, the stage 5 is moved in advance by the stage drive control circuit 47 to locate the reference mark of the reference plate 6 near the ideal irradiation position (designed irradiation position) of the selected electron beam. The main control system 48 causes the main deflector control circuit 44 to scan the reference mark by the selected electron beam and obtains, from the reflected electron detection circuit 45, information about reflected electrons from the reference mark. With this operation, the current irradiation position of the electron beam can be detected. In step S105, the above processing is executed for all electron beams. On the basis of the actual electron beam irradiation position for each column, the main control system 48 obtains the image rotation and magnification factor of a corresponding column.

Figure 13A:
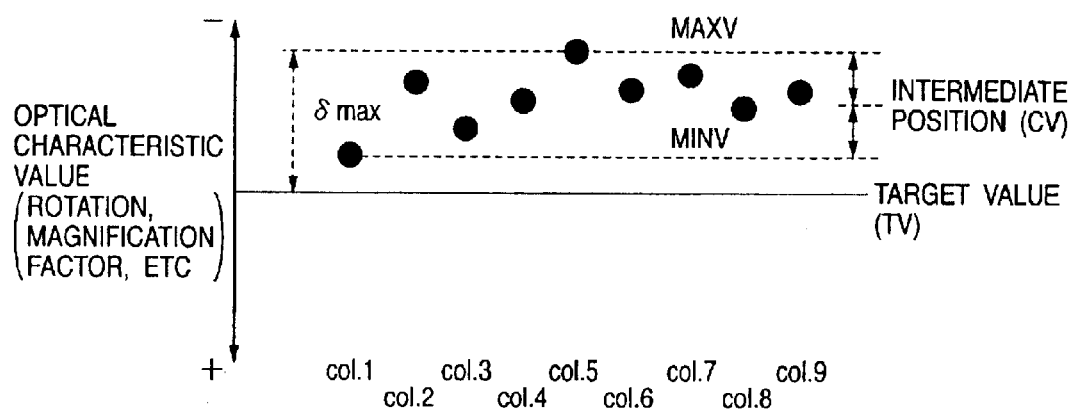
FIGS. 13A and 13B are graphs for image rotation/ magnification factor adjustment by electromagnetic lens arrays.

In step S106, as shown in FIG. 13A, the main control system 48 detects a maximum value (MAXV) and minimum value (MINV) from the image rotation/magnification factor obtained for each column, and determines an intermediate value (CV).

Figure 13B:
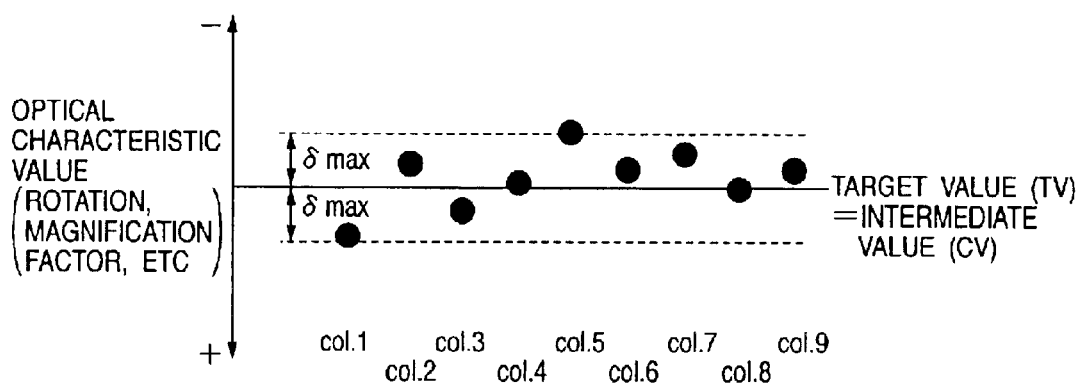

In step S107, the main control system 48 instructs the electromagnetic lens array control circuit 46 to adjust the common coils of the electromagnetic lens arrays 21, 22, 23, and 24 such that the intermediate value (CV) matches a target value (TV) and to move only the image rotations/magnification factors by an almost predetermined amount for all columns (i.e., the focal positions are not changed). Consequently, a result as shown in FIG. 13B is obtained. More specifically, the maximum value (δ max) of the difference between the target value and the actual image rotation/magnification factor of each column is minimized. In the next step, accordingly, the adjustment amount by the deflector arrays 105 and 106 serving as magnification factor correcting units arranged for each column can be minimized. This means that the plurality of deflectors that constitute the deflector arrays 105 and 106 serving as image rotation/magnification factor correcting units arranged for each column can be made compact, and interference between the plurality of deflectors can be minimized.

In step S107, the main control system 48 controls the deflector arrays 105 and 106 serving as image rotation/magnification factor correcting units to adjust the rotations and magnification factors of corresponding images on the basis of the difference between the target value and the actual image rotation/magnification factor of each column, as shown in FIG. 13B, such that the image rotation/magnification factor matches the target value. Correction of image rotation/magnification factor is done by individually controlling the plurality of deflectors that constitute the deflector arrays 105 and 106.

Preferred embodiments of the blanking aperture array (blanker array). 107 and a method of manufacturing the blanker array 107 of the present invention will be described below.

<First Embodiment>

FIGS. 1A to 1M are sectional views for explaining the first embodiment of a method of manufacturing a blanking aperture array (array structure) 107 of an electron beam exposure apparatus. FIGS. 1A to 1M show only one pair of blanking electrodes (one blanker) of a plurality of pairs of blanking electrodes (a plurality of blankers) for the illustrative convenience. "One pair" appropriately used in the following description represents "a plurality of pairs" of constituent elements.

Figure 1A:
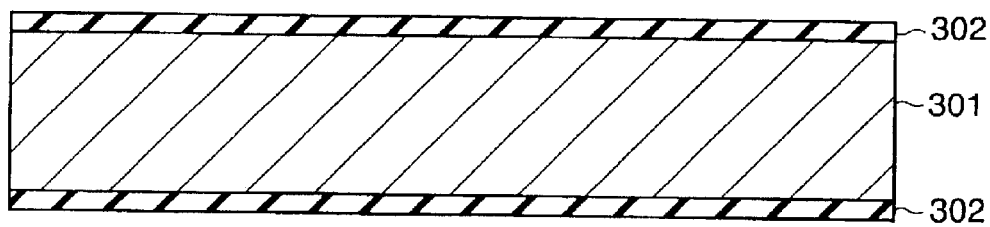
FIGS. 1A to 1M are sectional views for explaining the first embodiment of a method of manufacturing a blanking aperture array (array structure) of an electron beam exposure apparatus.

First, as a substrate 301, an Si wafer having, e.g., a diameter of 4 inches (100 mm) and a thickness of 200 μm is prepared. As shown in FIG. 1A, about 1-μm thick Si nitride films serving as insulating layers 302 are formed on both the upper and lower surfaces of the substrate 301 by plasma CVD.

Figure 1B:
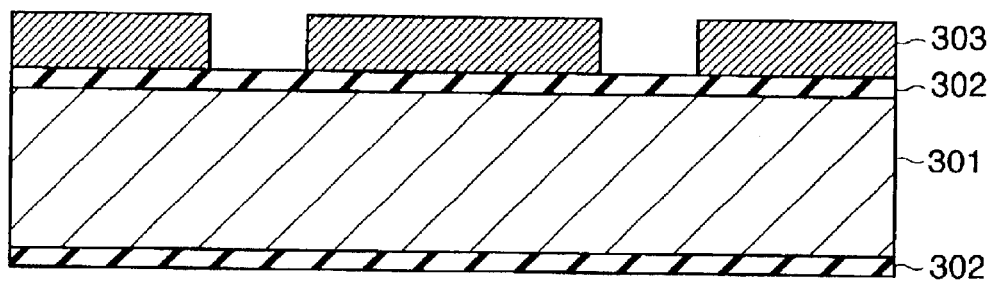

As shown in FIG. 1B, a resist is applied to the insulating layer 302 and patterned by exposure and development processes to form a resist pattern 303 which covers portions except regions corresponding to a plurality of trenches. The insulating layer 302 is removed by, e.g., reactive ion etching (RIE) using the resist pattern 303 as an etching mask.

Figure 1C:
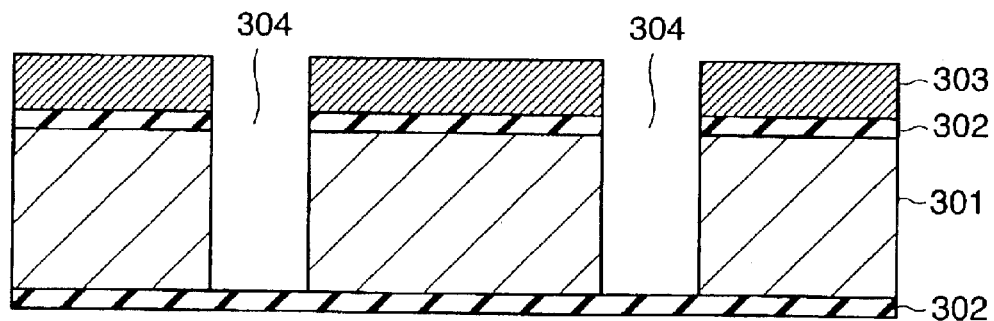

As shown in FIG. 1C, the substrate (Si wafer) 301 is processed by inductively coupled plasma (ICP)-RIE using the resist pattern 303 and insulating layer 302 as an etching mask, thereby forming a plurality of trenches 304. At this time, the insulating layer (Si nitride film) 302 formed on the lower surface of the substrate 301 functions as an etching stopper layer. The insulating layer 302 also functions as a layer which electrically insulates a conductive layer 306 (to be described later) from the substrate 301.

Figure 1D:
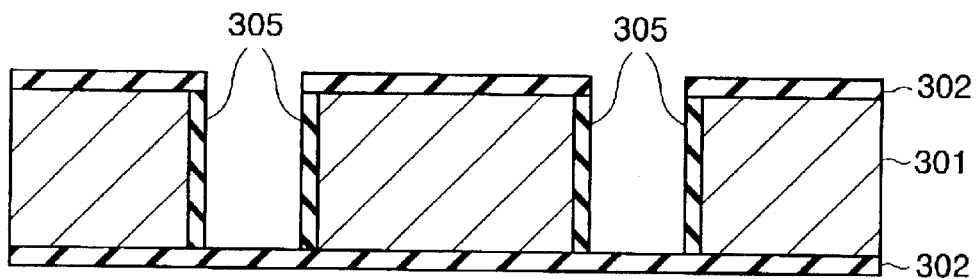

As shown in FIG. 1D, the resist pattern 303 is removed. Then, the substrate 301 is oxidized by thermal oxidation to form Si oxide films each having a thickness of, e.g., 2 μm and serving as an insulating layer 305 on the side surfaces of the pair of trenches 304 in the substrate 301. The insulating layer 305 electrically insulates a conductive member (blanking electrode) 308 (to be described later) from substrate 301.

Figure 1E:
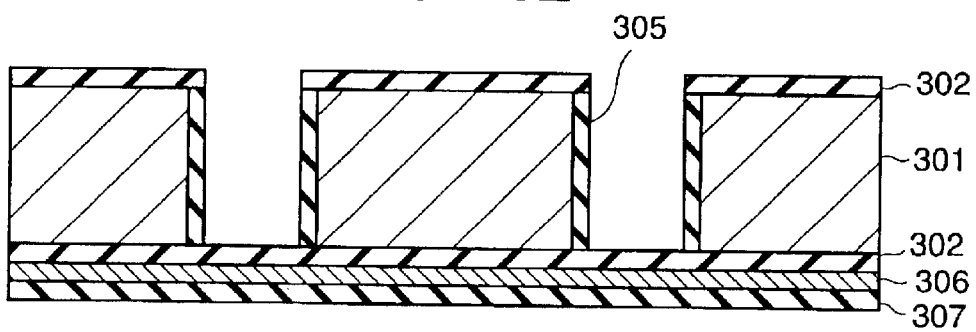

As shown in FIG. 1E, a multilayered film serving as the conductive layer 306 is formed on the lower surface of the substrate 301 by sequentially forming a Cr film, Pt film, and Cr film by, e.g., EB deposition. Of the Cr/Pt/Cr multilayered film as the conductive layer 306, for example, the Cr film can have a thickness of 500 Å, the Pt film can have a thickness of 2,000 Å, and the Cr film can have a thickness of 500 Å. In addition, an Si oxide film having a thickness of about 1 μm and serving as an insulating layer 307 is formed on the conductive layer 306 by plasma CVD.

Figure 1F:
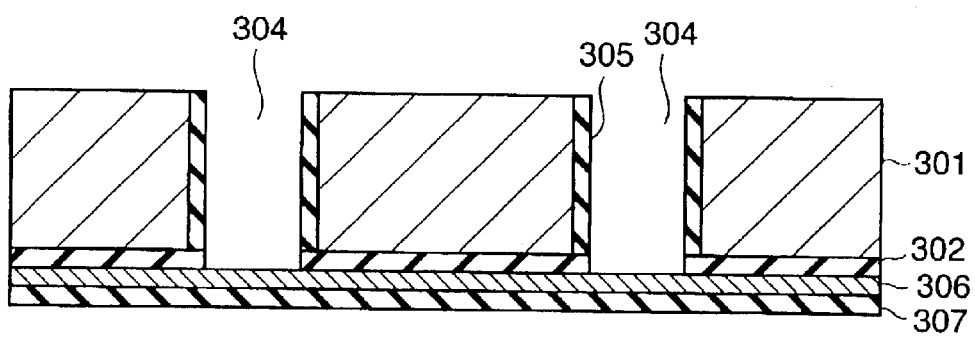

As shown in FIG. 1F, while leaving the insulating layers 305 located on the side surfaces of the pair of trenches 304, the insulating layer 302 on the upper surface side of the substrate 301 and only the insulating layers 302 located at the bottom portions of the pair of trenches 304 are selectively etched and removed by, e.g., RIE until the conductive layer 306 is exposed to the bottom portions of the pair of trenches 304. As another method, the insulating layer 302 on the upper surface side of the substrate 301 and only the insulating layers 302 located at the bottom portions of the pair of trenches 304 may be removed by wet etching using, e.g., hot phosphoric acid while leaving the insulating layers 305 located on the side surfaces of the pair of trenches 304. Alternatively, the insulating layers 305 may be formed sufficiently thick in the step shown in FIG. 1D such that the insulating layers 305 having a desired thickness (a thickness at which the layers can function as insulating layers) remain even after the insulating layer 302 on the upper surface side of the substrate 301 and the insulating layers 302 located at the bottom portions of the pair of trenches 304 are completely etched.

Figure 1G:
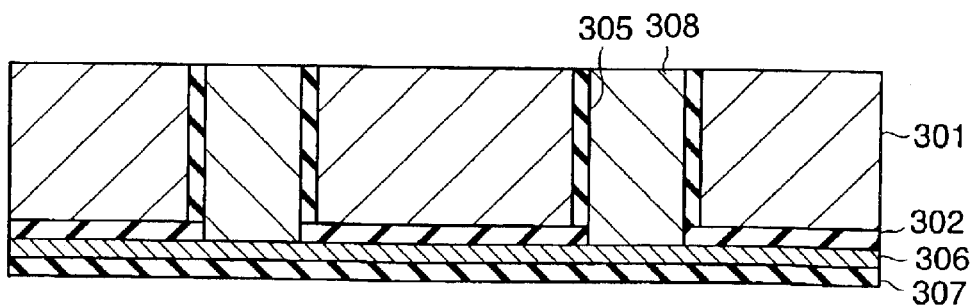

As shown in FIG. 1G, using the conductive layer 306 exposed to the bottom portions of the pair of trenches 304 as a plating electrode (seed layer), plating is selectively performed in the pair of trenches 304 by electrolyte plating to fill the trenches with the conductive layers (blanking electrodes) 306 made of gold or the like. In other words, according to this manufacturing method, the conductive member 308 can selectively be grown in the pair of trenches 304. At this time, the insulating layer 307 on the lower surface of the substrate 301 acts as a protective layer which prevents the conductive layer 306 except those exposed into the trenches 304 from being plated.

After the trenches 304 are filled with the conductive members 308, the unnecessary conductive members 308 are removed by, e.g., chemical mechanical polishing (CMP). To increase the adhesion between the insulating layer 305 made of the Si oxide film and the conductive member 308 made of gold, a Cr film may be formed on the surface of the insulating layer 305 by sputtering before gold plating. As a plating material, not gold but, e.g., copper may be used. With the above process, a pair of blanking electrodes are formed.

Figure 1H:
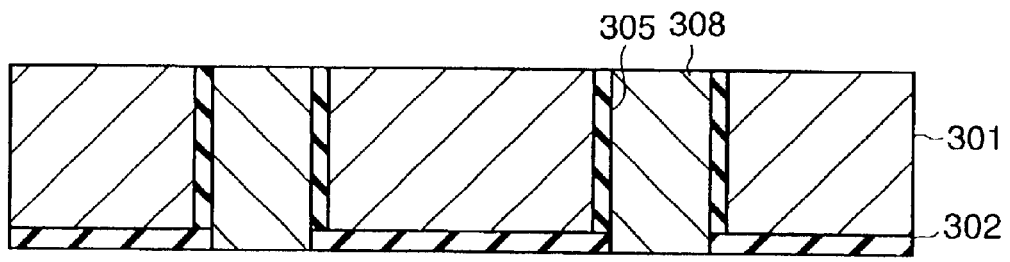

As shown in FIG. 1H, the conductive layer 306 and insulating layer 307 located on the lower surface of the substrate 301 are etched and removed by RIE.

Figure 1I:
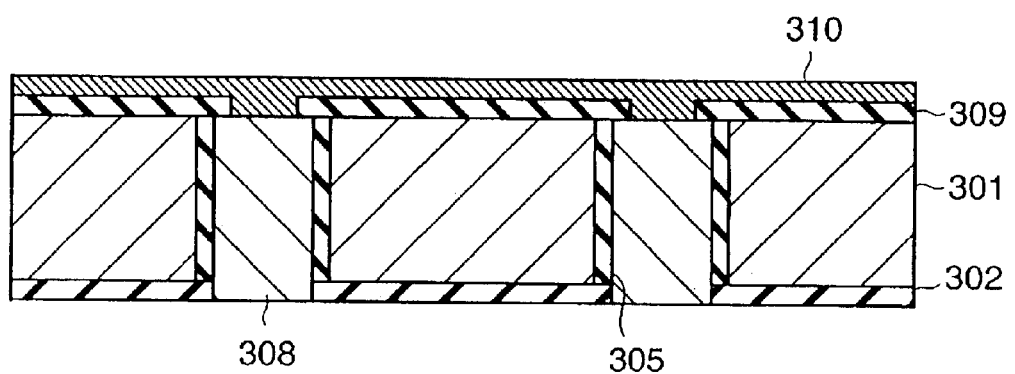

As shown in FIG. 1I, an Si oxide film having a thickness of about 1 μm and serving as an insulating film 309 is formed on the upper surface side of the substrate 301 by plasma CVD. A resist is applied to the insulating film 309 and patterned by exposure and development processes to form a resist pattern having openings in predetermined regions on the conductive members 308. The insulating layer 309 in the predetermined regions is removed by, e.g., reactive ion etching (RIE) using the resist pattern 303 as an etching mask. After the resist pattern is removed, gold serving as an interconnection layer 310 is deposited on the entire surface of the substrate by sputtering.

Figure 1J:
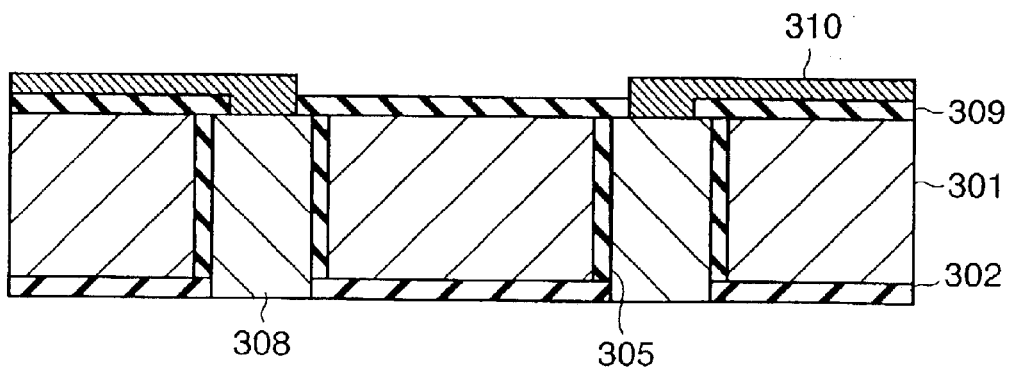

As shown in FIG. 1J, a resist is applied to the interconnection layer 310 and patterned by exposure and development processes to form a resist pattern. The exposed interconnection layer 310 is removed by, e.g., reactive ion etching (RIE) to form an interconnection pattern using the resist pattern as an etching mask. With this interconnection pattern, the plurality of pairs of blanking electrodes can individually be controlled.

Figure 1K:
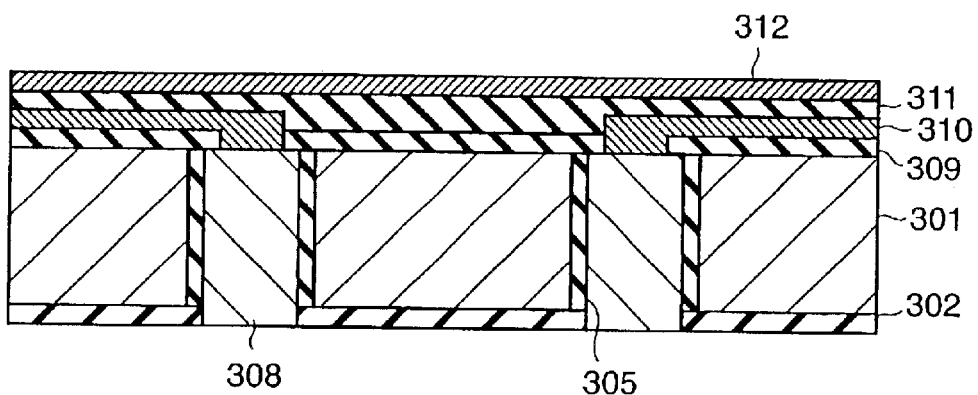

As shown in FIG. 1K, an Si oxide film having a thickness of about 1 μm and serving as an insulating layer 311 is formed on the upper surface side of the substrate 301 by plasma CVD. Gold serving as a conductive layer 312 is deposited on the entire surface of the insulating layer 311 by sputtering. The conductive layer 312 functions as an anti-charge-up metal layer and is grounded.

Figure 1L:
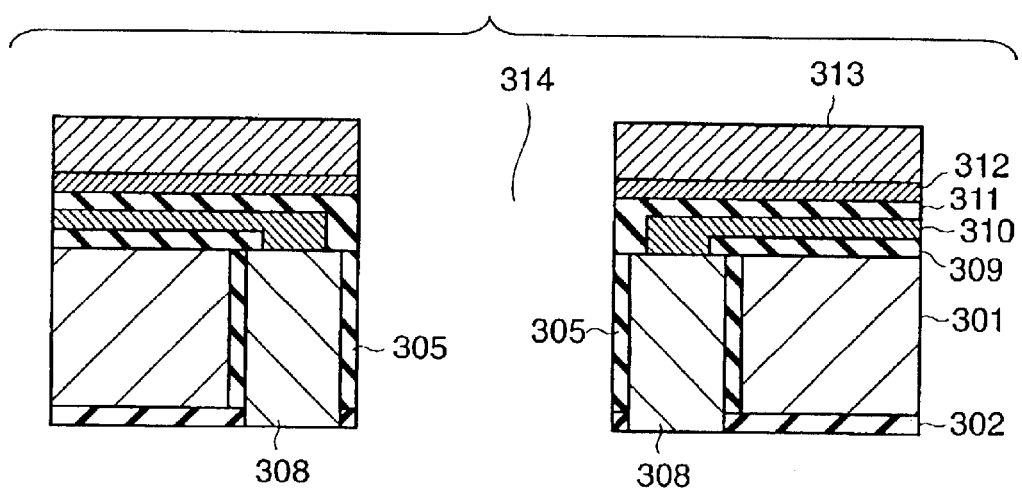

As shown in FIG. 1L, a resist is applied to the conductive layer 312 and patterned by exposure and development processes to form a resist pattern 313 having an opening between the pair of conductive members (blanking electrodes) 308. The conductive layer 312 is etched by, e.g., ion milling using the resist pattern 313 as an etching mask. Next, the insulating layer 311 and insulating film 309 are etched by reactive ion etching (RIE). After the substrate 301 is etched by ICP-RIE through the opening portion of the resist pattern 313, the insulating layer (Si nitride film) 302 is removed by reactive ion etching (RIE) through the opening portion. As a result, an opening 314 is formed between the insulating layers 305 inside the pair of conductive members (blanking electrodes) 308. At this time, the insulating layer 302 functions as an etching stopper layer when the substrate 301 is etched.

Figure 1M:
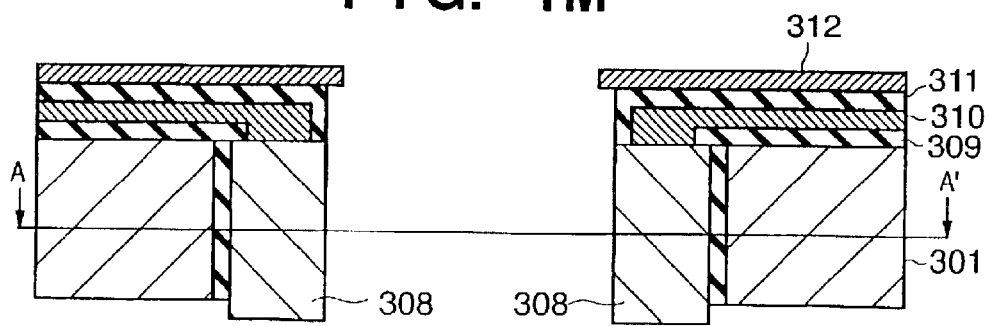

As shown in FIG. 1M, the insulating layers 305 formed from Si oxide films on the sidewall portions of the opening 314 are removed by wet etching using a solution mixture of HF and NH$_4$F. In addition, the insulating layer (Si nitride film) 302 is removed by wet etching using, e.g., hot phosphoric acid. Thus, the blanking aperture array 107 is completed.

Figure 2:
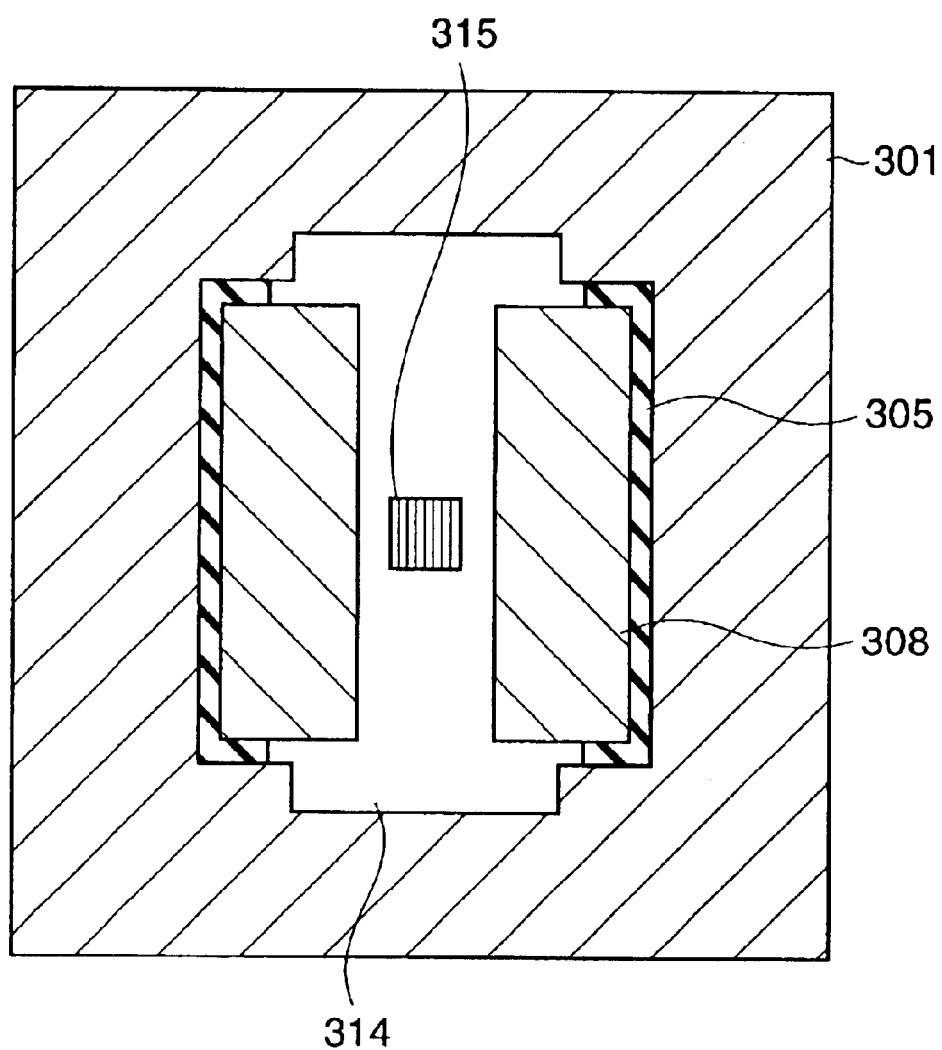
FIG. 2 is a sectional view taken along a line A-A' in FIG. 1M.

FIG. 2 is a sectional view taken along a line A-A' in FIG. 1M. As shown in FIG. 2, the pair of conductive members 308 serving as blanking electrodes oppose each other via the path of an electron beam 315 that passes through the opening 314. The pair of conductive members 308 are fixed to the substrate 301 through the corresponding insulating layers 305. The conductive members 308 are arranged between the electron beam 315 and the pair of insulating layers 305. Hence, even when the insulating layers 305 are charged up, an electric field formed by charges is shielded from the electron beam 315 by the blanking electrode formed from the conductive member 308.

Figure 3:
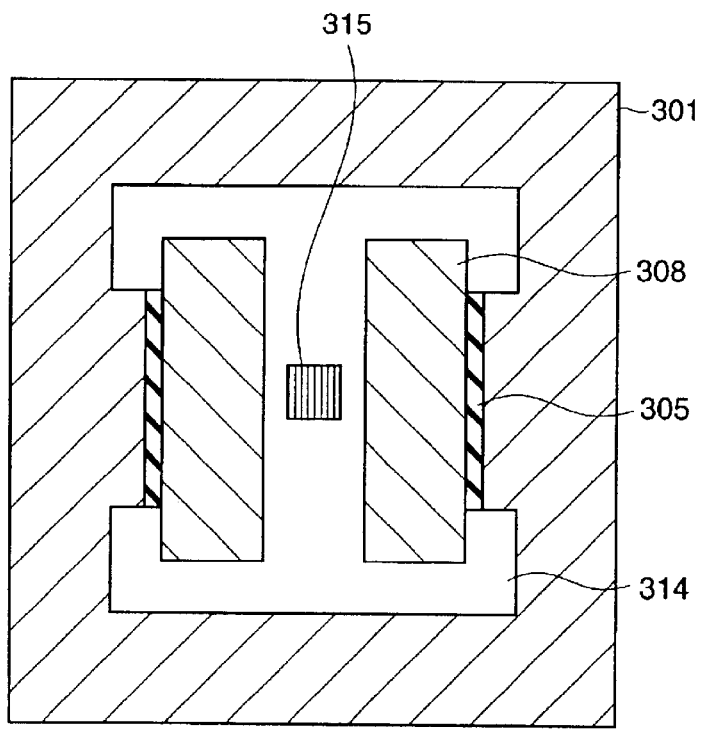
FIG. 3 is a view showing an opening structure having a high shield effect.

FIG. 3 is a view showing a structure having a high shield effect by electrodes. In this structure, the influence of an electric field which is formed by the electric field of the insulating layer 305 when charged up on the electron beam 315 that passes through the opening of the blanking aperture array is small, as compared to the structure shown in FIG. 2.

<Second Embodiment>

FIGS. 4A to 4M are sectional views for explaining the second embodiment of a method of manufacturing a blanking aperture array (array structure) 107 of an electron beam exposure apparatus. FIGS. 4A to 4M show only one pair of blanking electrodes (one blanker) of a plurality of pairs of blanking electrodes (a plurality of blankers) for the illustrative convenience. "One pair" appropriately used in the following description represents "a plurality of pairs" of constituent elements.

Figure 4A:
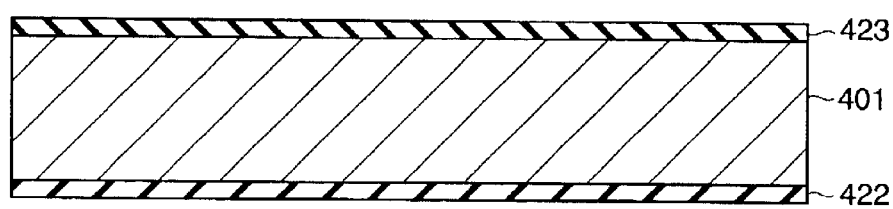

First, as a substrate 401, an Si wafer having, e.g., a diameter of 4 inches (100 mm) and a thickness of 200 μm is prepared. As shown in FIG. 4A, an Si nitride film having a thickness of about 1 μm and serving as an insulating layer 422 is formed on the lower surface of the substrate 401 by plasma CVD. Then, the substrate 401 is oxidized by thermal oxidation to form an Si oxide film having a thickness of, e.g., about 1 μm and serving as an insulating layer 423 on the upper surface of the substrate 401.

Figure 4B:
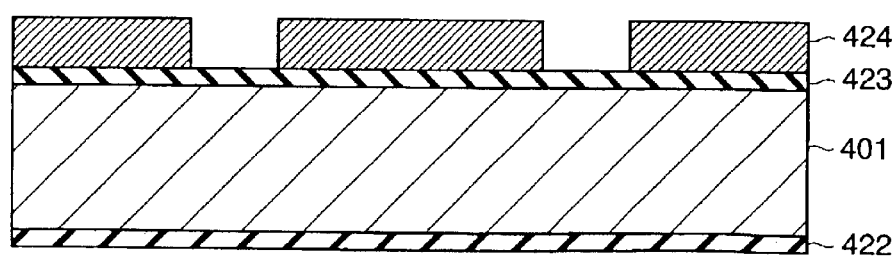

As shown in FIG. 4B, a resist is applied to the insulating layer 423 and patterned by exposure and development processes to form a resist pattern 424 having openings in regions where trenches should be formed. The insulating layer 423 is removed by, e.g., reactive ion etching (RIE) through the openings using the resist pattern 424 as an etching mask.

Figure 4C:
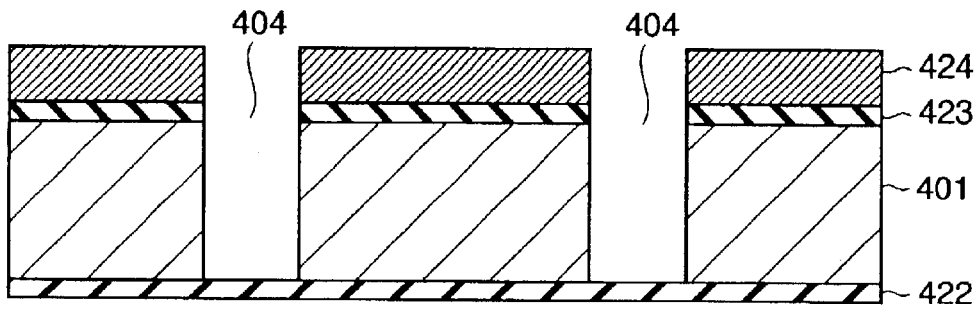

As shown in FIG. 4C, the substrate (Si wafer) 401 is processed by inductively coupled plasma (ICP)-RIE using the resist 424 and insulating layer 423 as an etching mask, thereby forming a plurality of trenches 404. At this time, the insulating layer (Si nitride film) 422 formed on the lower surface of the substrate 401 functions as an etching stopper layer in etching the substrate 401. The insulating layer 422 also functions as a layer which electrically insulates a conductive layer 426 (to be described later) from the substrate 401.

Figure 4D:
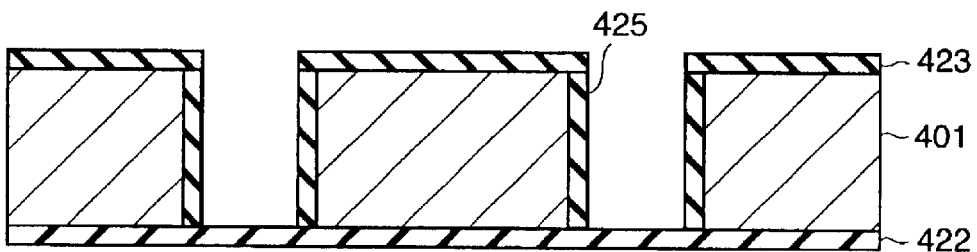

As shown in FIG. 4D, the resist 424 is removed. Then, the substrate 401 is oxidized by thermal oxidation to form Si oxide films each having a thickness of, e.g., 2 μm and serving as an insulating layer 425 on the side surfaces of the pair of trenches 404 in the substrate 401. The insulating layer 425 electrically insulates a conductive member 428 (to be described later) from the substrate 401.

Figure 4E:
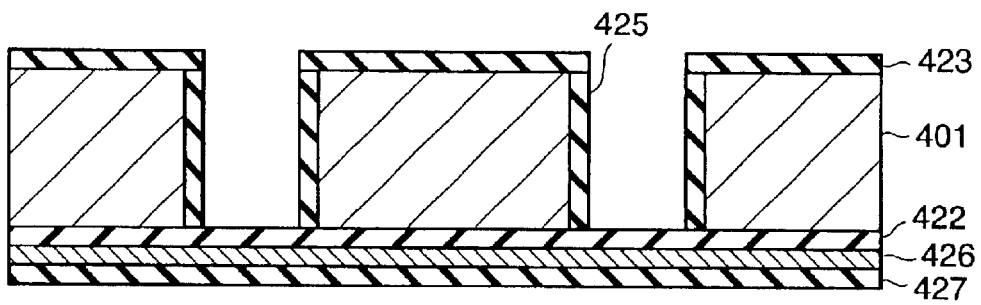

As shown in FIG. 4E, a multilayered film serving as the conductive layer 426 is formed on the lower surface of the substrate 401 by sequentially forming a Cr film, Pt film, and Cr film by, e.g., EB deposition. In addition, an Si oxide film having a thickness of about 1 μm and serving as an insulating layer 427 is formed on the conductive layer 426 by plasma CVD.

Figure 4F:
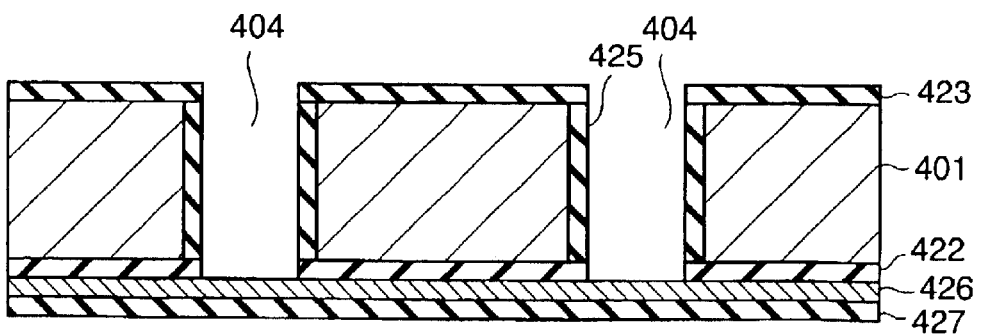

As shown in FIG. 4F, only the insulating layers 422 located at the bottom portions of the pair of trenches 404 are selectively etched and removed by wet etching using, e.g., hot phosphoric acid until the conductive layer 426 is exposed to the bottom portions of the pair of trenches 404.

Figure 4G:
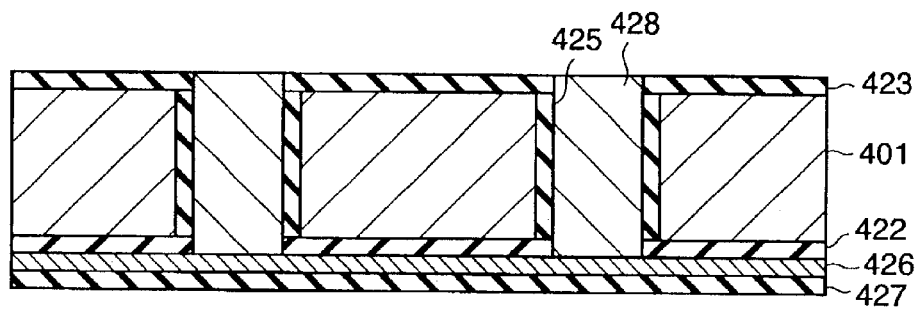

As shown in FIG. 4G, tungsten serving as the conductive member (blanking electrode) 428 is selectively grown on the conductive layer 426 exposed to the bottom portion of each of the pair of trenches 404 by plasma CVD, thereby filling the pair of trenches 404 with the conductive members 428. After the trenches 404 are filled with the conductive members 428, the unnecessary conductive members 428 are removed by, e.g., chemical mechanical polishing (CMP). With the above process, a pair of blanking electrodes are formed.

Figure 4H:
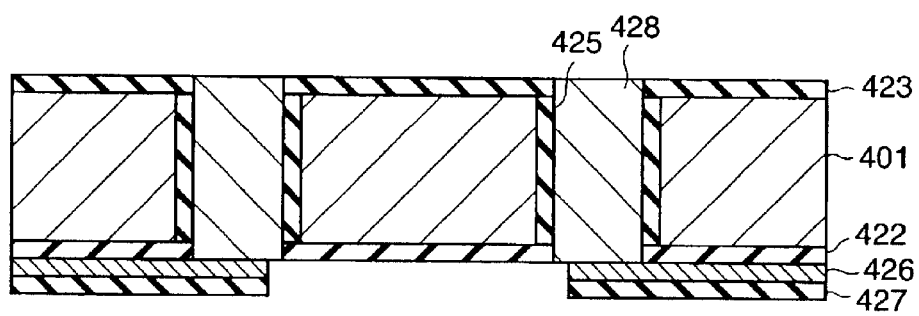

As shown in FIG. 4H, a resist is applied to the insulating layer 427 and patterned by exposure and development processes to form a resist pattern which covers portions other than regions corresponding to an interconnection pattern that interconnects the blanking electrodes. The insulating layer 427 and conductive layer 426 are removed by, e.g., reactive ion etching (RIE) using the resist pattern as an etching mask, thereby forming an electrode interconnection pattern from the conductive layer 426. With this interconnection pattern, the plurality of pairs of blanking electrodes can individually be controlled.

Figure 4I:
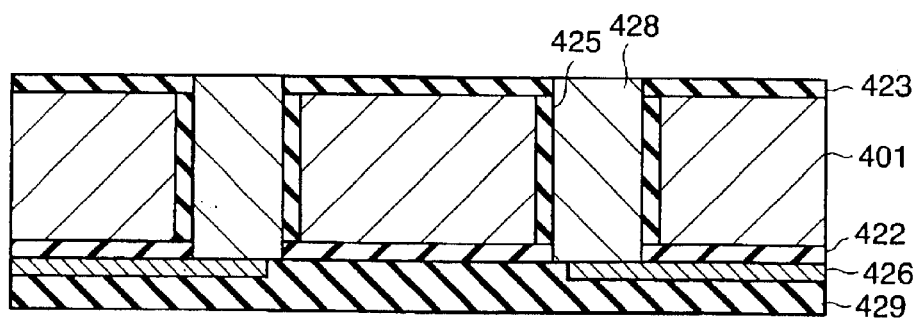

As shown in FIG. 4I, an Si oxide film serving as an insulating layer 429 is formed on the lower surface side of the substrate 401 by plasma CVD.

Figure 4J:
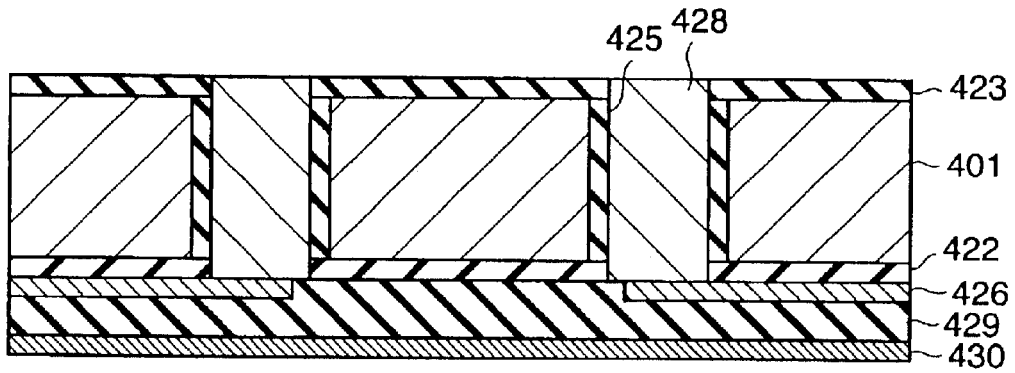

As shown in FIG. 4J, gold serving as a conductive layer 430 is deposited on the entire surface of the insulating layer 429 by sputtering. The conductive layer 430 functions as an anti-charge-up metal layer and is grounded.

Figure 4K:
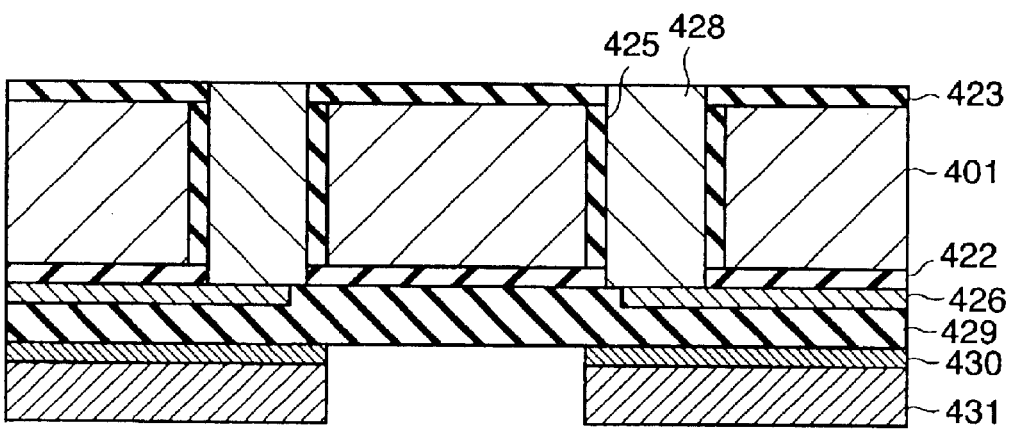

As shown in FIG. 4K, a resist is applied to the conductive layer 430 and patterned by exposure and development processes to form a resist pattern 431 having an opening between the pair of conductive members (blanking electrodes) 428.

Figure 4L:
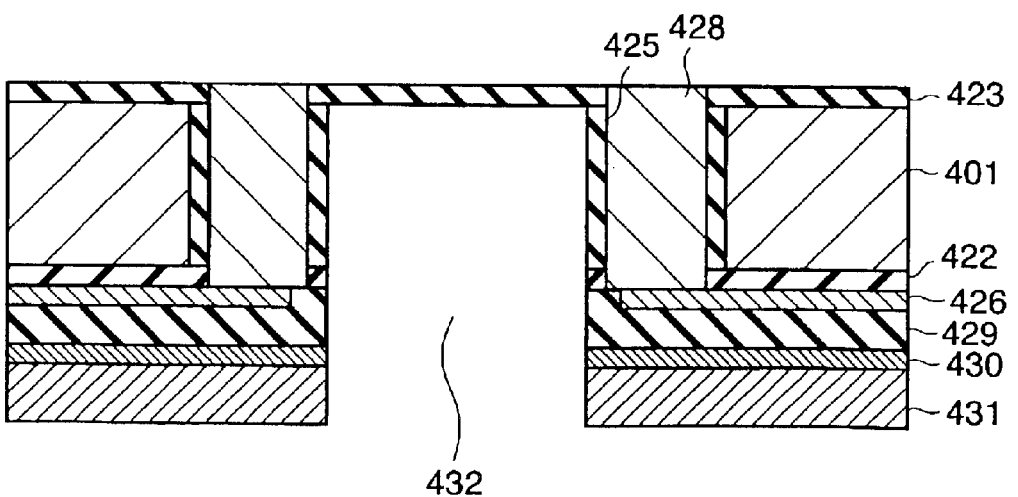

The conductive layer 430 is etched by, e.g., ion milling using the resist pattern 431 as an etching mask. As shown in FIG. 4L, the insulating layer 429 and insulating layer 422 are sequentially etched by reactive ion etching (RIE) through the opening of the resist pattern 431. In addition, the substrate 401 is etched by ICP-RIE through the opening of the resist pattern 431. As a result, an opening 432 is formed between the insulating layers 425 inside the pair of conductive members (blanking electrodes) 428.

As shown in FIG. 4M, the insulating layers 425 formed from Si oxide films on the side surfaces of the opening 432 and the insulating layer 423 formed from an Si oxide film are removed by wet etching using a solution mixture of HF and $NH_4F$. In addition, the Si nitride films 422 located on the sidewall portions of the opening 432 are removed by wet etching using, e.g., hot phosphoric acid. Thus, the blanking aperture array 107 is completed.

<Third Embodiment>

Figure 16A:
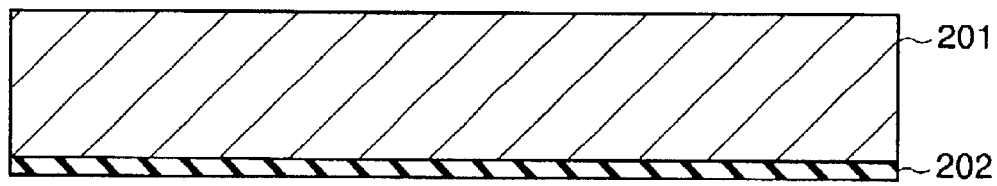
FIGS. 16A to 16N are sectional views for explaining a preferred method of manufacturing a blanking aperture array of an electron beam exposure apparatus.

FIGS. 16A to 16N are sectional views for explaining a preferred manufacturing method of a blanking aperture array (array structure) 107 of an electron beam exposure apparatus. FIGS. 16A to 16N show only one pair of blanking electrodes (one blanker) of a plurality of pairs of blanking electrodes (a plurality of blankers) for the illustrative convenience. "One pair" appropriately used in the following description represents "a plurality of pairs" of constituent elements.

First, as a substrate 201, an Si wafer having, e.g., a diameter of 4 inches (100 mm) and a thickness of 200 μm is prepared. As shown in FIG. 16A, an Si oxide film having a thickness of about 1 μm and serving as an insulating layer 202 is formed on the lower surface of the substrate 201 by, e.g., plasma CVD using tetraethyoxysilane (TEOS) as a source.

Figure 16B:
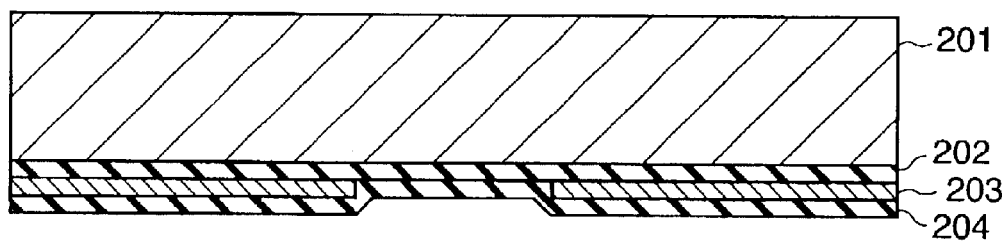

As shown in FIG. 16B, a Cr/Pt/Cr multilayered film having a 500-Å thick Cr film, 2000-Å thick Pt film, and 500-Å thick Cr film is formed on the insulating layer 202 as an interconnection layer 203 by, e.g., lift-off. Then, an Si oxide film having a thickness of about 0.5 μm and serving as an insulating layer 204 is formed on the interconnection layer 203 using plasma CVD. The interconnection layer 203 is patterned such that a plurality of blanking electrodes to be formed later can individually be controlled.

Figure 16C:
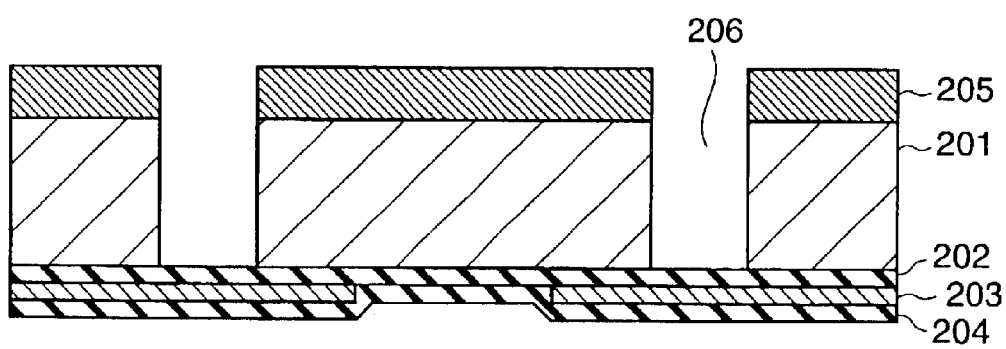

As shown in FIG. 16C, a resist is applied to the upper surface of the substrate 201 and patterned by exposure and development processes to form a resist pattern 205. The substrate 201 is processed by inductively coupled plasma (ICP)-RIE using the resist pattern 205 as an etching mask, thereby forming a pair of trenches 206. At this time, the insulating layer 202 functions as an etching stopper layer in etching the substrate 201.

Figure 16D:
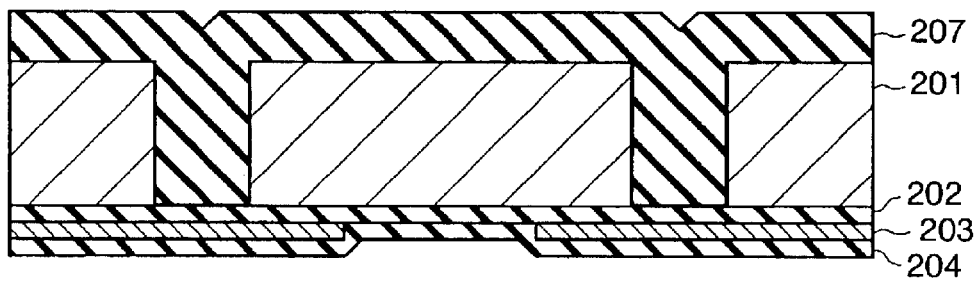

As shown in FIG. 16D, the resist 205 on the substrate 201 is removed by ashing and resist removing liquid. After that, to fill the pair of trenches 206 with insulating members, an Si oxide film having a thickness of about 20 μm and serving as an insulating layer 207 is formed by plasma CVD using, e.g., TEOS as a source.

Figure 16E:
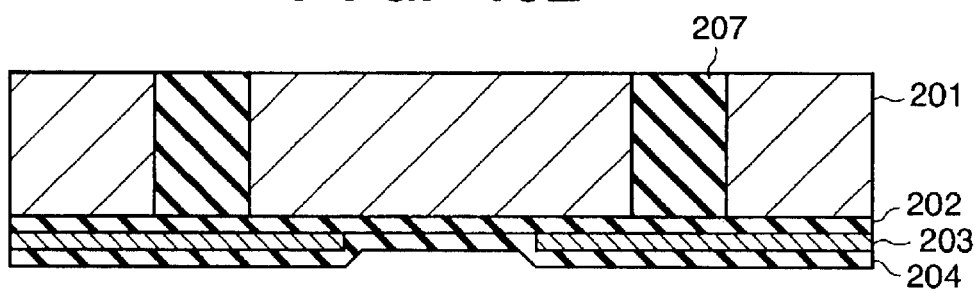

As shown in FIG. 16E, the insulating member 207 is polished by chemical mechanical polishing (CMP) using a slurry made of, e.g., fumed silica, KOH, and water until the surface of the substrate 201 is exposed.

Figure 16F:
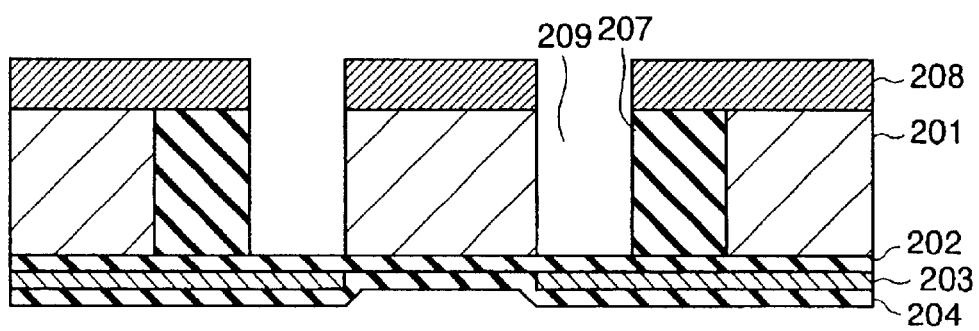

As shown in FIG. 16F, a resist is applied to the substrate 201 and patterned by exposure and development processes to form a resist pattern 208. The substrate 201 is dry-etched by ICP-RIE using the resist pattern 208 as an etching mask, thereby forming a pair of trenches 209 inside the pair of insulating members 207 to be adjacent to the pair of insulating members 207. At this time, the insulating layer 202 functions as an etching stopper layer.

Figure 16G:
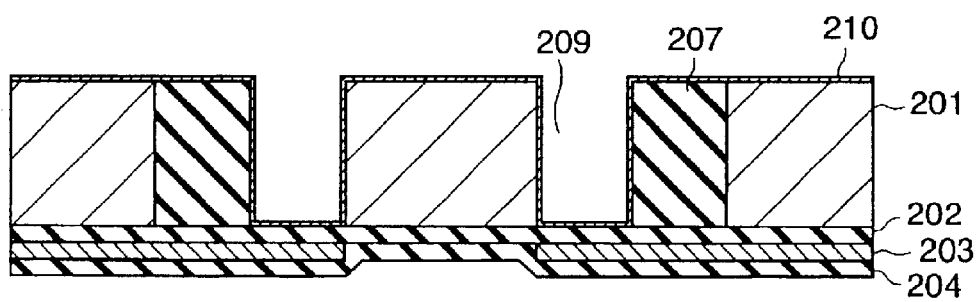

As shown in FIG. 16G, the resist pattern 208 on the substrate 201 is removed. Then, a Cr film 210 having a thickness of about 500 Å is formed on the entire surface on the upper surface side of the substrate 201 by, e.g. sputtering.

Figure 16H:
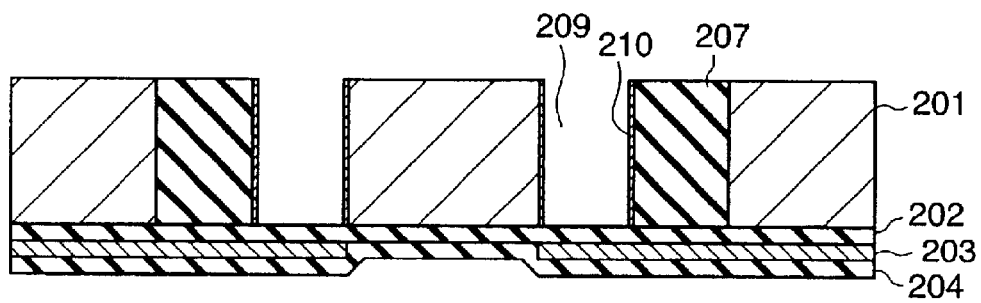

As shown in FIG. 16H, the Cr film 210 is anisotropically etched by, e.g., RIE to remove the Cr films 210 except those on the sidewall portions of the trenches 209.

Figure 16I:
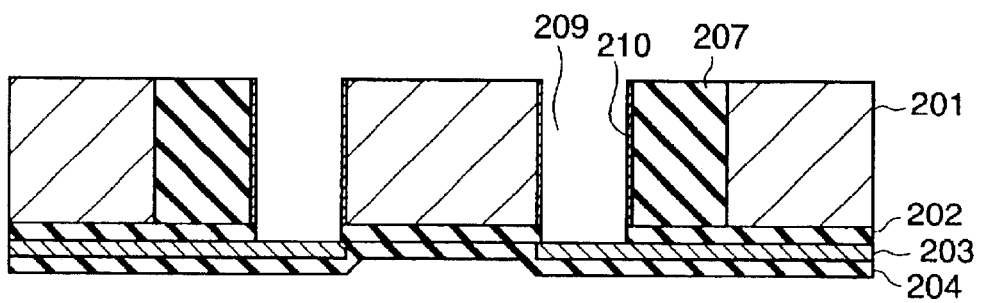

As shown in FIG. 16I, the insulating layer 202 located at the bottom portion of each of the trenches 209 extending through the substrate 201 is removed by, e.g., RIE.

Figure 16J:
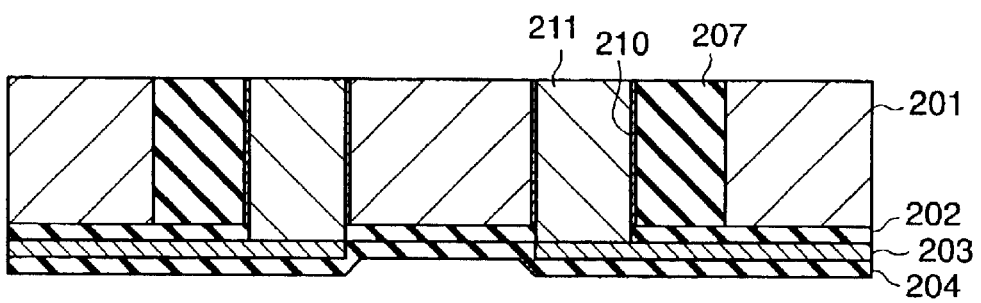

As shown in FIG. 16J, conductive members (blanking electrodes) 211 made of, e.g. gold are buried in the trenches 209 formed in the substrate 201 by electrolyte plating using the interconnection layer 203 as a plating electrode. After that, gold that projects from the substrate 201 is removed by, e.g. CMP using a predetermined slurry.

Figure 16K:
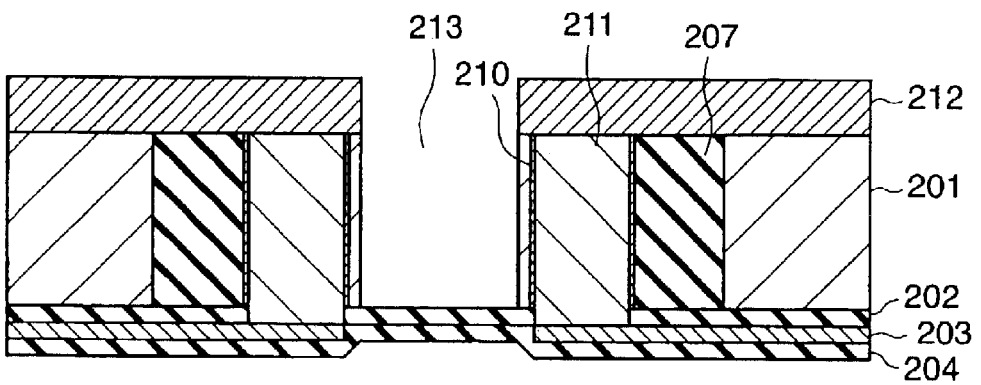

As shown in FIG. 16K, a resist is applied to the substrate 201 and patterned by exposure and development processes to form a resist pattern 212. The substrate 201 is dry-etched by ICP-RIE using the resist pattern 212 as an etching mask, thereby forming an opening 213 in the substrate 201.

As shown in FIG. 16L, for example, a resist 214 is applied to the lower surface of the substrate 201 to protect the lower surface. In addition, after the structure is baked, Si on each sidewall portion of the opening 213 is removed by, e.g., RIE. At this time, to remove Si on each sidewall portion of the opening 213, not RIE but wet etching using, e.g., a TMAH solution may be used.

As shown in FIG. 16M, the insulating layers 202 and 204 exposed to the opening are removed by wet etching using a solution mixture of HF and $NH_4F$.

As shown in FIG. 16N, the Cr films 210 formed on the sidewalls of the conductive members 211 are removed by wet etching using, e.g., an aqueous solution of ammonium cerium nitride. After that, the resist patterns 212 and 214 are removed using ashing and resist removing liquid. Thus, the blanking aperture array 107 is completed.

Figure 17:
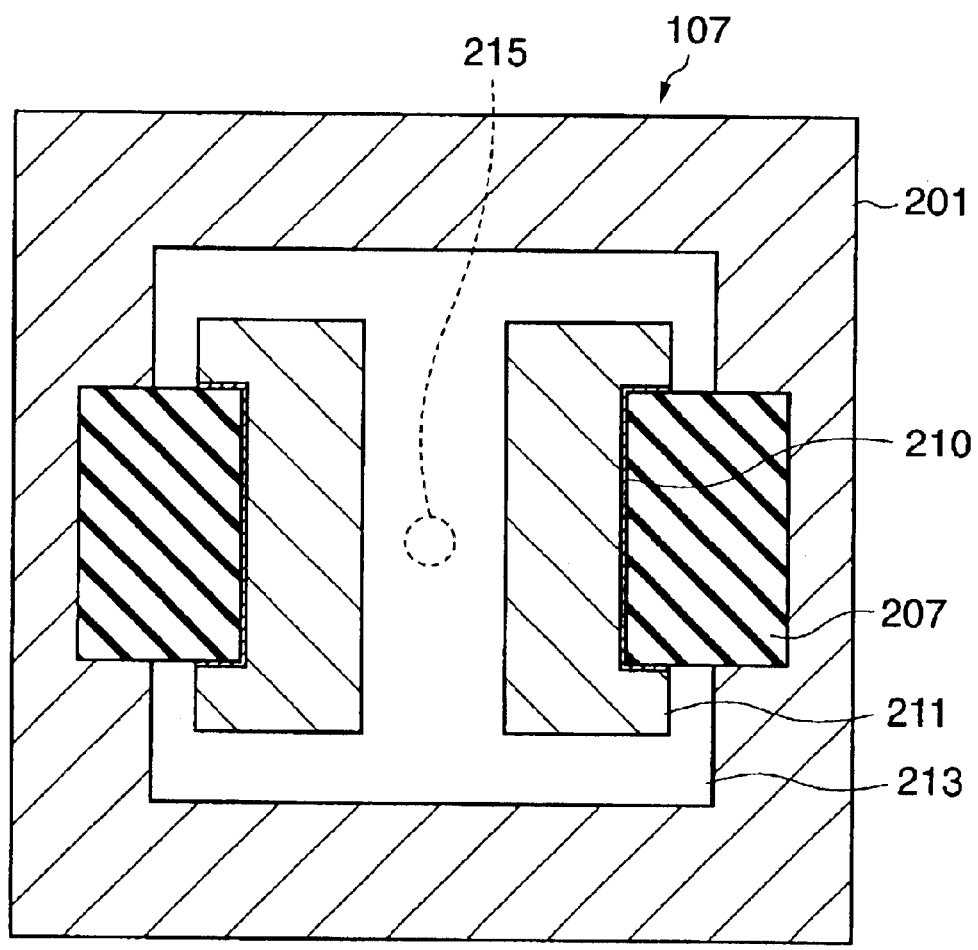
FIG. 17 is a sectional view taken along a line A-A' in FIG. 16N.

FIG. 17 is a sectional view taken along a line A-A' in FIG. 16N. As shown in FIG. 17, the pair of conductive members 211 serving as blanking electrodes oppose each other via the path of an electron beam 215 that passes through the opening 213. The pair of conductive members 211 are fixed to the substrate 201 through the corresponding insulating layers 207. The conductive members 211 are arranged between the electron beam 215 and the pair of insulating layers 207. Hence, even when the insulating layers 207 are charged up, an electric field formed by charges is shielded from the electron beam 215 by the conductive member 211.

Figure 18:
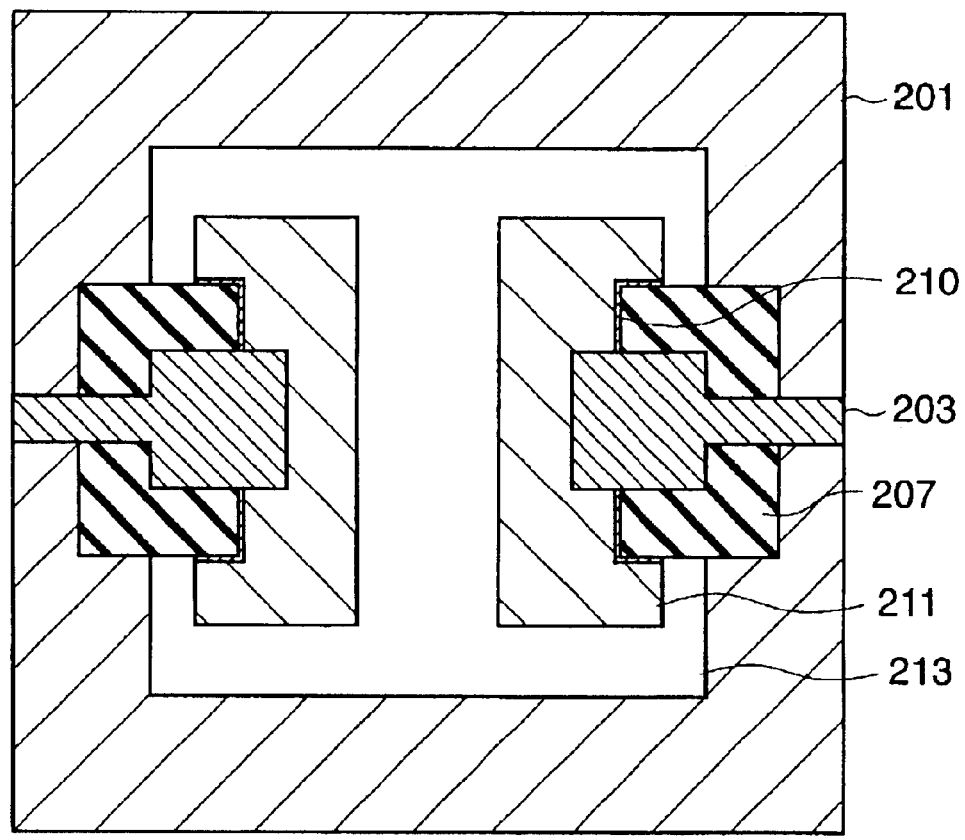
FIG. 18 is a sectional view taken along a line B-B' in FIG. 16N.
Figure 19A:
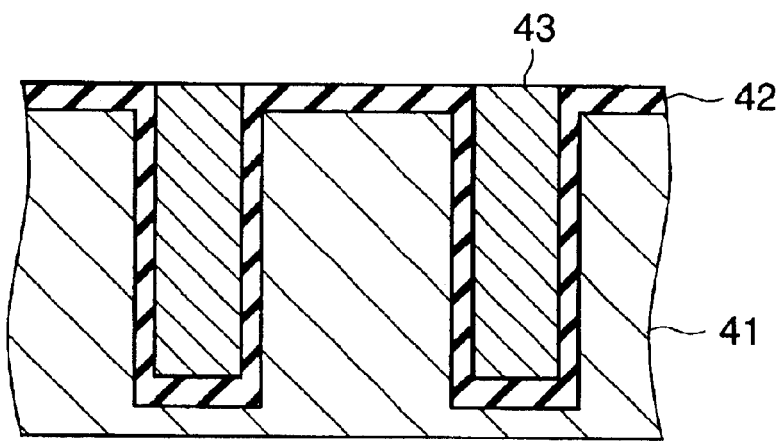
FIGS. 19A and 19B are views for explaining a conventional blanking electrode forming method.
Figure 19B:
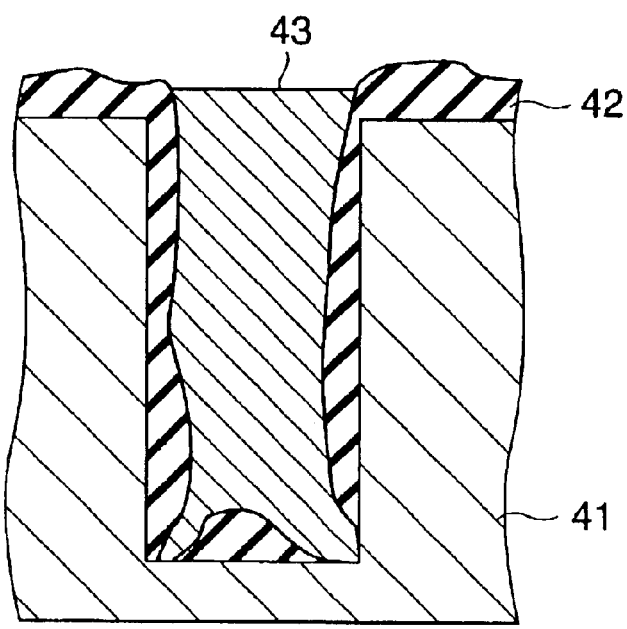

FIG. 18 is a sectional view taken along a line B-B' in FIG. 16N. As shown in FIG. 18, a predetermined potential is applied from the interconnection layer 203 that is in contact with the conductive members 211 to the conductive members 211 serving as blanking electrodes. Since the insulating layers 207 are sufficiently thick, even when the pattern of the interconnection layer 203 is shifted from the designed position, the interconnection layer 203 is not short-circuited to the substrate 201 connected to ground.

(Device Producing Method)

A device production method using a charged particle beam exposure apparatus such as the electron beam exposure apparatus described above will now be described.

Figure 14:
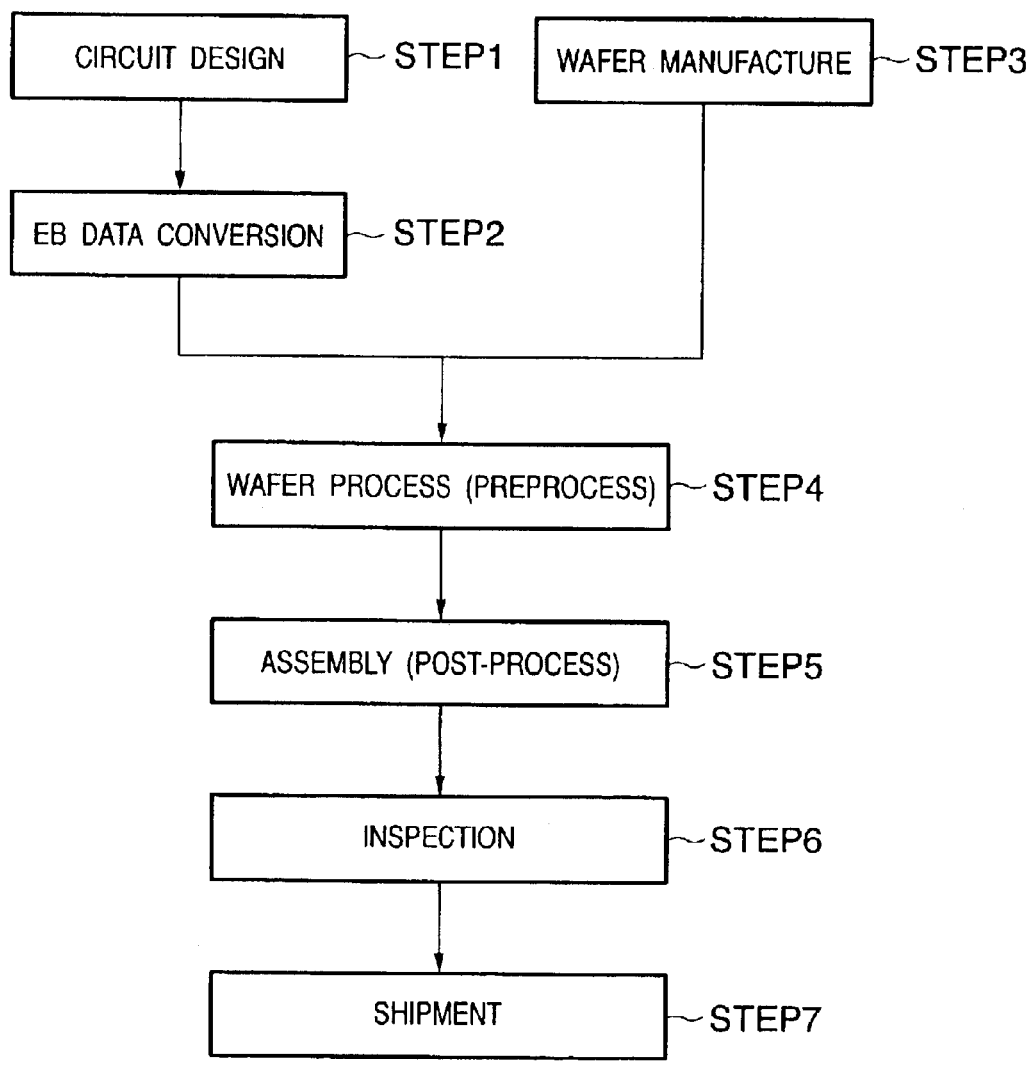
FIG. 14 is a flow chart for explaining a microdevice manufacturing flow.

FIG. 14 is a flow chart showing the flow of manufacturing a microdevice (e.g., a semiconductor chip such as an IC or an LSI, a liquid crystal panel, a CCD, a thin-film magnetic head, or a micromachine). In step 1 (circuit design), the circuit of a semiconductor device is designed. In step 2 (exposure control data generation), exposure control data of the exposure apparatus is generated on the basis of the designed circuit pattern. In step 3 (wafer manufacture), a wafer is manufactured using a material such as silicon. In step 4 (wafer process) called a preprocess, an actual circuit is formed on the wafer by lithography using the wafer and the exposure apparatus to which the prepared exposure control data is input. In step 5 (assembly) called a post-process, a semiconductor chip is formed from the wafer prepared in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped (step 7).

Figure 15:
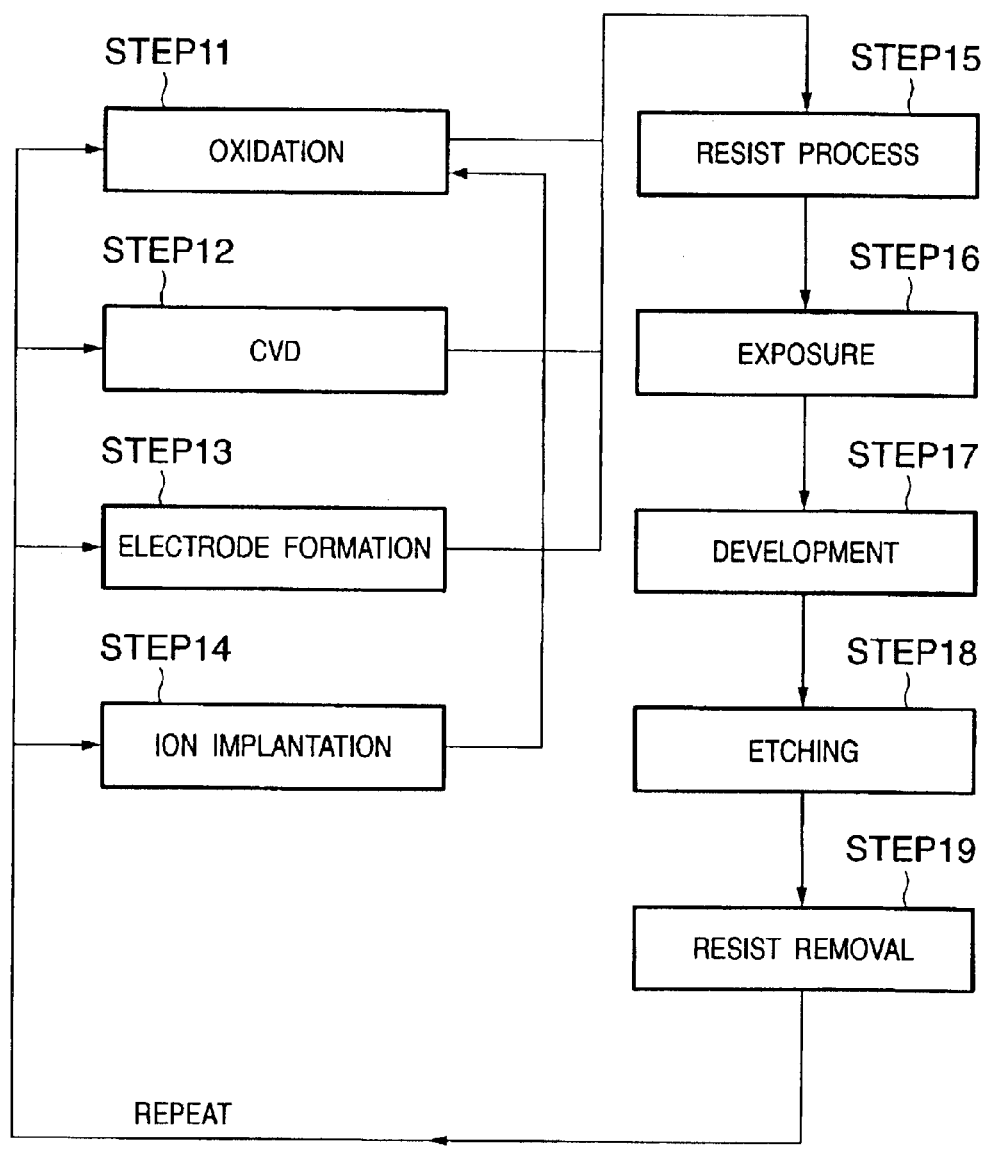
FIG. 15 is a flow chart for explaining a wafer process.

FIG. 15 shows details of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern is formed on the wafer by the above-described exposure apparatus. In the exposure apparatus, the focal position is adjusted for each column, and image rotation and magnification factor are adjusted for each column. In step 17 (development), the exposed wafer is developed. In step 18 (etching), portions other than the developed resist image are etched. In step 19 (resist removal), any unnecessary resist remaining after etching is removed. By repeating these steps, a multilayered structure of circuit patterns is formed on the wafer.

When this manufacturing method is used, a highly integrated semiconductor device that is conventionally difficult to manufacture can be manufactured at a low cost.

According to the present invention, a highly reliable array structure such as a blanking aperture array can be manufactured at a high yield.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing an array structure having a plurality of openings and a plurality of pairs of opposing electrodes which are arranged in correspondence with each of the plurality of openings to control loci of a plurality of charged particle beams that pass through the plurality of openings, respectively, comprising:

a trench formation step of forming a plurality of pairs of opposing trenches in a substrate;

a side-surface insulating layer formation step of forming an insulating layer on a side surface of each of the plurality of pairs of opposing trenches;

a process step of processing the plurality of pairs of trenches to expose a conductive layer to a bottom portion of each of the plurality of pairs of opposing trenches;

an electrode formation step of selectively growing a conductive material on the conductive layer exposed to the bottom portion of each of the plurality of pairs of trenches to fill the plurality of pairs of trenches with the conductive material, thereby forming a plurality of pairs of opposing electrodes; and an opening formation step of forming an opening between each of the pairs of opposing electrodes.

2. The method according to claim 1, wherein in the electrode formation step, the conductive material is grown in the plurality of pairs of opposing trenches by plating using, as a plating electrode, the conductive layer exposed to the bottom portion of each of the plurality of pairs of opposing trenches.

3. The method according to claim 1, further comprising a lower-surface-side insulating layer formation step of, before the trench formation step, forming an insulating layer on a lower surface side of the substrate while defining, as an upper surface side, one of two surfaces of the substrate, where formation of the plurality of pairs of opposing trenches starts in the trench formation step, and a conductive layer formation step of, after the lower-surface-side insulating layer formation step before the process step, forming the conductive layer on the insulating layer on the lower surface side of the substrate.

4. The method according to claim 2, further comprising a lower-surface-side first insulating layer formation step of, before the trench formation step, forming a first insulating layer on a lower surface side of the substrate while defining, as an upper surface side, one of two surfaces of the substrate, where formation of the plurality of pairs of opposing trenches starts in the trench formation step, a conductive layer formation step of, after the lower-surface-side first insulating layer formation step before the process step, forming the conductive layer on the insulating layer on the lower surface side of the substrate, and a lower-surface-side second insulating layer formation step of, after the conductive layer formation step before the electrode formation step, forming a second insulating layer on, of exposing surfaces of the conductive layer, a surface opposite to the plurality of pairs of opposing trenches.

5. The method according to claim 3, wherein in the process step, the conductive layer is exposed to the bottom portion by selectively etching an insulating layer at the bottom portion of each of the plurality of pairs of opposing trenches while leaving the insulating layer having a sufficient thickness formed on the side surface of each of the plurality of pairs of opposing trenches.

6. The method according to claim 1, wherein a silicon substrate is used as the substrate, and in the side-surface insulating layer formation step, the insulating layer is formed on the side surface by thermally oxidizing at least the side surface of each of the plurality of pairs of opposing trenches.

7. The method according to claim 1, further comprising an interconnection layer formation step of forming an interconnection layer to be electrically connected to the plurality of pairs of opposing electrodes.

8. The method according to claim 7, wherein in the interconnection layer formation step, the interconnection layer is formed on a side of one of two surfaces of the substrate, where formation of the plurality of pairs of opposing trenches starts in the trench formation step.

9. The method according to claim 7, wherein in the interconnection layer formation step, the interconnection layer is formed on an opposite side to one of two surfaces of the substrate, where formation of the plurality of pairs of opposing trenches starts in the trench formation step.

10. The method according to claim 7, wherein in the interconnection layer formation step, the interconnection layer which can individually control a potential difference to be applied to each of the plurality of pairs of opposing electrodes is formed.

11. The method according to claim 1, wherein in the trench formation step, the plurality of pairs of opposing trenches are so formed as to cause the plurality of pairs of opposing electrodes formed by filling the plurality of pairs of opposing trenches with the conductive material to shield the plurality of charged particle beams from insulating layers outside the plurality of pairs of opposing electrodes.

12. A charged particle beam exposure apparatus which forms a pattern on a wafer using a plurality of charged particle beams, comprising:
a blanking aperture array which controls loci of the plurality of charged particle beams to individually control whether the wafer is to be irradiated with the plurality of charged particle beams,
wherein the blanking aperture array is an array structure manufactured by a manufacturing method of claim 1.

13. A device manufacturing method comprising steps of:
forming a pattern on a wafer using a charged particle beam exposure apparatus of claim 12; and
developing the wafer on which the pattern is formed.

14. A method of manufacturing an array structure having a plurality of openings and a plurality of pairs of opposing electrodes which are arranged in correspondence with each of the plurality of openings to control loci of a plurality of charged particle beams that pass through the plurality of openings, respectively, comprising:
a first trench formation step of forming a plurality of pairs of opposing first trenches in a substrate;
an insulating layer formation step of filling the opposing first trenches with an insulating material to form a plurality of pairs of opposing insulating layers;
a second trench formation step of forming a plurality of pairs of opposing second trenches to be arranged inside the plurality of pairs of opposing insulating layers;
an electrode formation step of filling the opposing second trenches with a conductive material to form a plurality of pairs of opposing electrodes; and
an opening formation step of forming an opening between each of the pairs of opposing electrodes.

15. The method according to claim 14, further comprising an interconnection layer formation step of forming an interconnection layer which applies a potential difference to the pairs of opposing electrodes.

16. The method according to claim 15, wherein in the interconnection layer formation step, the interconnection layer which can individually control the potential difference to be applied to each of the plurality of pairs of opposing electrodes is formed.

17. The method according to claim 15, wherein the interconnection layer formation step is executed before the second trench formation step, and in the second trench formation step, the plurality of pairs of opposing second trenches are formed to communicate with the interconnection layer formed in the interconnection layer formation step.

18. The method according to claim 17, wherein in the electrode formation step, the plurality of pairs of opposing second trenches are filled with the conductive material by plating using, as a plating electrode, the interconnection layer exposed to the bottom portion of each of the plurality of pairs of opposing second trenches after the second trench formation step.

19. The method according to claim 14, wherein in the insulating layer formation step, the plurality of pairs of opposing first trenches are filled with silicon oxide as the insulating material formed using TEOS.

20. The method according to claim 14, wherein the method further comprises a step of forming an insulating layer on a lower surface of the substrate, and in the first trench formation step, the plurality of pairs of opposing first trenches are formed by etching a predetermined portion of the substrate using the insulating layer formed on the lower surface of the substrate as an etching stopper.

21. The method according to claim 14, wherein in the second trench formation step, the plurality of pairs of opposing second trenches are so formed as to cause the plurality of pairs of opposing electrodes formed by filling the plurality of pairs of opposing second trenches with the conductive material to shield the plurality of charged particle beams from the plurality of pairs of opposing insulating layers.

22. An array structure having a plurality of openings formed in a substrate and a plurality of pairs of opposing electrodes which are arranged in correspondence with each of the plurality of openings to control loci of a plurality of charged particle beams that pass through the plurality of openings, respectively,
wherein each of the opposing electrodes is supported by the substrate through an insulating layer and arranged to shield a charged particle beam that passes between the opposing electrodes from the insulating layer.

23. The structure according to claim 22, wherein the plurality of pairs of opposing electrodes are formed by plating.

24. The structure according to claim 22, wherein the insulating layer is formed by forming a trench in the substrate and then filling the trench with an insulating material.

25. The structure according to claim 24, wherein filling of the insulating material is done by depositing a silicon oxide film using TEOS.

26. A charged particle beam exposure apparatus which forms a pattern on a wafer using a plurality of charged particle beams, comprising:
a blanking aperture array which controls loci of the plurality of charged particle beams to individually control whether the wafer is to be irradiated with the plurality of charged particle beams,
wherein the blanking aperture array is an array structure manufactured by a manufacturing method of claim 11.

27. A charged particle beam exposure apparatus which forms a pattern on a wafer using a plurality of charged particle beams, comprising:
a blanking aperture array which controls loci of the plurality of charged particle beams to individually control whether the wafer is to be irradiated with the plurality of charged particle beams, wherein the blanking aperture array is an array structure of claim 22.

28. A device manufacturing method comprising steps of:

forming a pattern on a wafer using a charged particle beam exposure apparatus of claim 26; and developing the wafer on which the pattern is formed.

29. A device manufacturing method comprising steps of:

forming a pattern on a wafer using a charged particle beam exposure apparatus of claim 27; and developing the wafer on which the pattern is formed.

\* \* \* \* \*